(12) United States Patent  (10) Patent No.: US 9,357,669 B2
House  (45) Date of Patent: May 31, 2016

(54) REMOVABLE LOCKING COVER FOR RACK-MOUNTED EQUIPMENT

(71) Applicant: Mark Ireland House, Highlands Ranch, CO (US)

(72) Inventor: Mark Ireland House, Highlands Ranch, CO (US)

( * ) Notice: Subject to any disclaimer, the term of this patent is extended or adjusted under 35 U.S.C. 154(b) by 203 days.

(21) Appl. No.: 14/339,402

(22) Filed: Jul. 23, 2014

(65) Prior Publication Data

US 2016/0029509 A1  Jan. 28, 2016

(51) Int. Cl.
*H05K 7/14* (2006.01)
*H04Q 1/14* (2006.01)
*G06F 1/18* (2006.01)

(52) U.S. Cl.
CPC .............. *H05K 7/1487* (2013.01); *H04Q 1/14* (2013.01); *G06F 1/181* (2013.01)

(58) Field of Classification Search
CPC ... H05K 5/0208; H05K 7/186; H05K 7/1487; E05B 73/0082; E05C 3/042; G06F 1/181; G06F 1/187; Y10S 70/57; Y10T 70/5009; Y10T 70/5553; Y10T 70/5584; Y10T 70/5867; H04Q 1/14; E05D 15/5208; G02B 6/444; G02B 6/4441; A47B 96/00; A47B 57/583; A47B 57/585; A47B 96/04; A47F 7/147; A47F 5/005; A47F 5/132; H02B 1/26; H02B 1/202; B60R 16/0207; H01B 7/0045; H02G 3/0418; H02G 3/105
See application file for complete search history.

(56) References Cited

U.S. PATENT DOCUMENTS

| | | | |
|---|---|---|---|
| 4,898,009 A | 2/1990 | Lakoski et al. | |
| 6,049,451 A * | 4/2000 | Schmitt | E05B 63/143 312/216 |
| 6,295,204 B1 | 9/2001 | Gibbons et al. | |
| 6,393,883 B1 | 5/2002 | Freck | |
| 6,557,385 B1 | 5/2003 | Shih | |
| 6,816,370 B2 | 11/2004 | Searby et al. | |
| 6,891,723 B1 * | 5/2005 | Lin | G11B 33/025 312/223.1 |
| 6,925,843 B1 | 8/2005 | Pols Sandhu et al. | |
| 6,927,968 B2 * | 8/2005 | Pols Sandhu | H05K 5/0208 312/223.1 |
| 7,014,051 B2 | 3/2006 | Rumney | |
| 7,151,666 B2 * | 12/2006 | Song | H05K 7/1487 312/223.2 |
| 7,152,936 B2 | 12/2006 | Tarasewicz | |
| 7,232,193 B2 * | 6/2007 | Cunningham | G11B 33/12 312/223.2 |
| 7,347,514 B2 | 3/2008 | Laret et al. | |
| 7,375,955 B2 * | 5/2008 | Xu | G06F 1/181 361/679.55 |
| 7,423,869 B2 * | 9/2008 | Su | G06F 1/187 312/223.2 |
| 7,540,574 B2 * | 6/2009 | Wu | G06F 1/187 312/223.2 |
| 7,850,013 B1 | 12/2010 | Kramer et al. | |
| 7,911,788 B2 * | 3/2011 | Sasagawa | G06F 1/20 165/104.34 |
| 8,047,385 B2 * | 11/2011 | Hardy | A47F 1/12 211/59.3 |
| 8,519,859 B2 | 8/2013 | Forristal et al. | |
| 2003/0233855 A1 | 12/2003 | Pirveysian | |
| 2012/0056516 A1 | 3/2012 | Fan | |
| 2015/0282373 A1 * | 10/2015 | Abughazaleh | H05K 7/1488 312/273 |

* cited by examiner

*Primary Examiner* — Michael Zarroli

(57) ABSTRACT

An improved locking cover assembly to prevent access to rack-mounted equipment and the connections to and from conventional rack systems without trays or hinges. The locking cover assembly includes a three-sided front cover that slides onto mounting brackets, which are fastened to either the rack system via rack holes, rack ears, or over rack-mounted equipment. An internal tie bar allows the user to secure connections to the tie bar within the cover assembly. A locking mechanism attached to the front cover locks into the mounting brackets, and when locked, the cover assembly and mounting brackets preclude unauthorized access to the rack equipment, its connections, and the fasteners securing the both the rack-mounted equipment and mounting brackets.

20 Claims, 22 Drawing Sheets

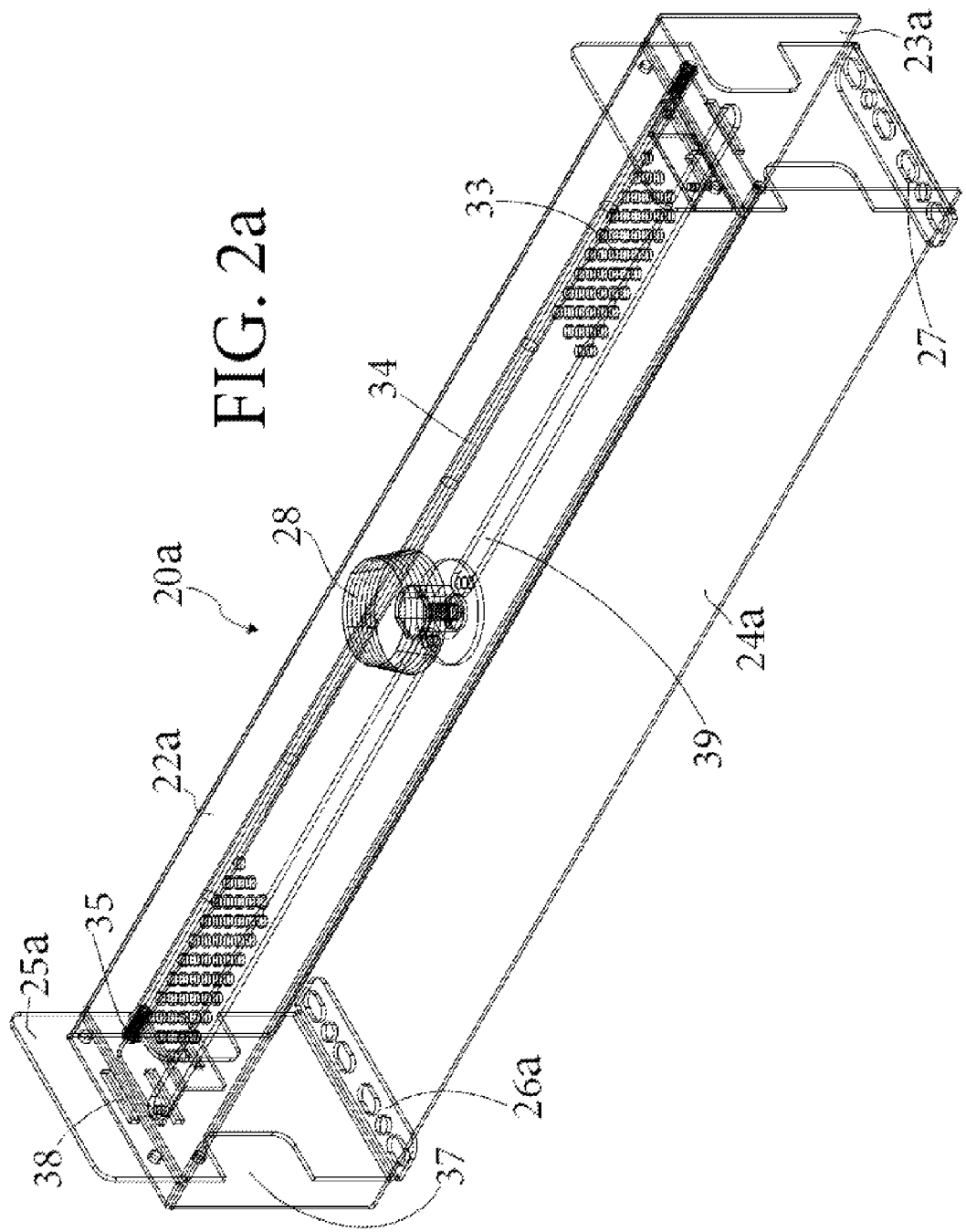

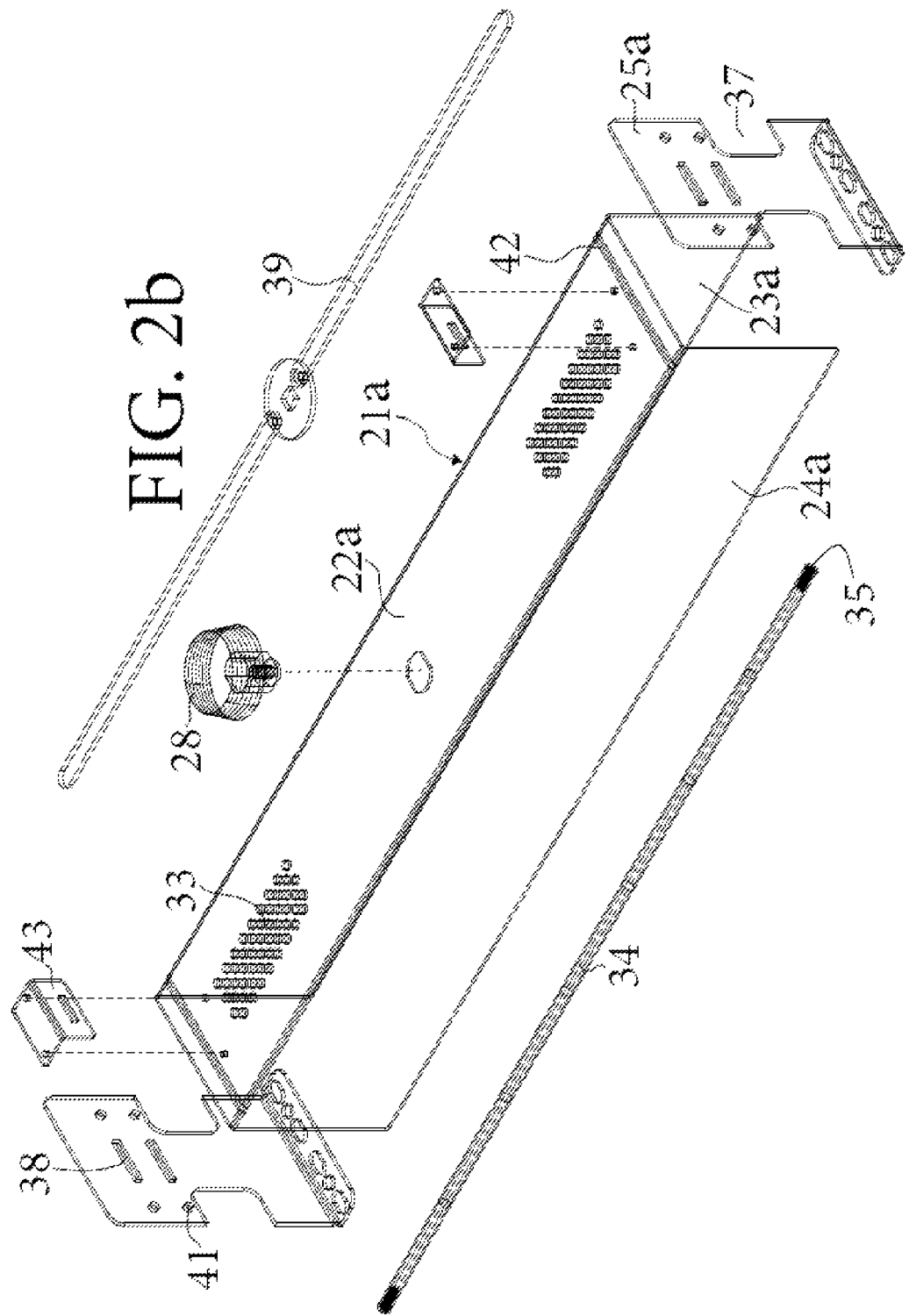

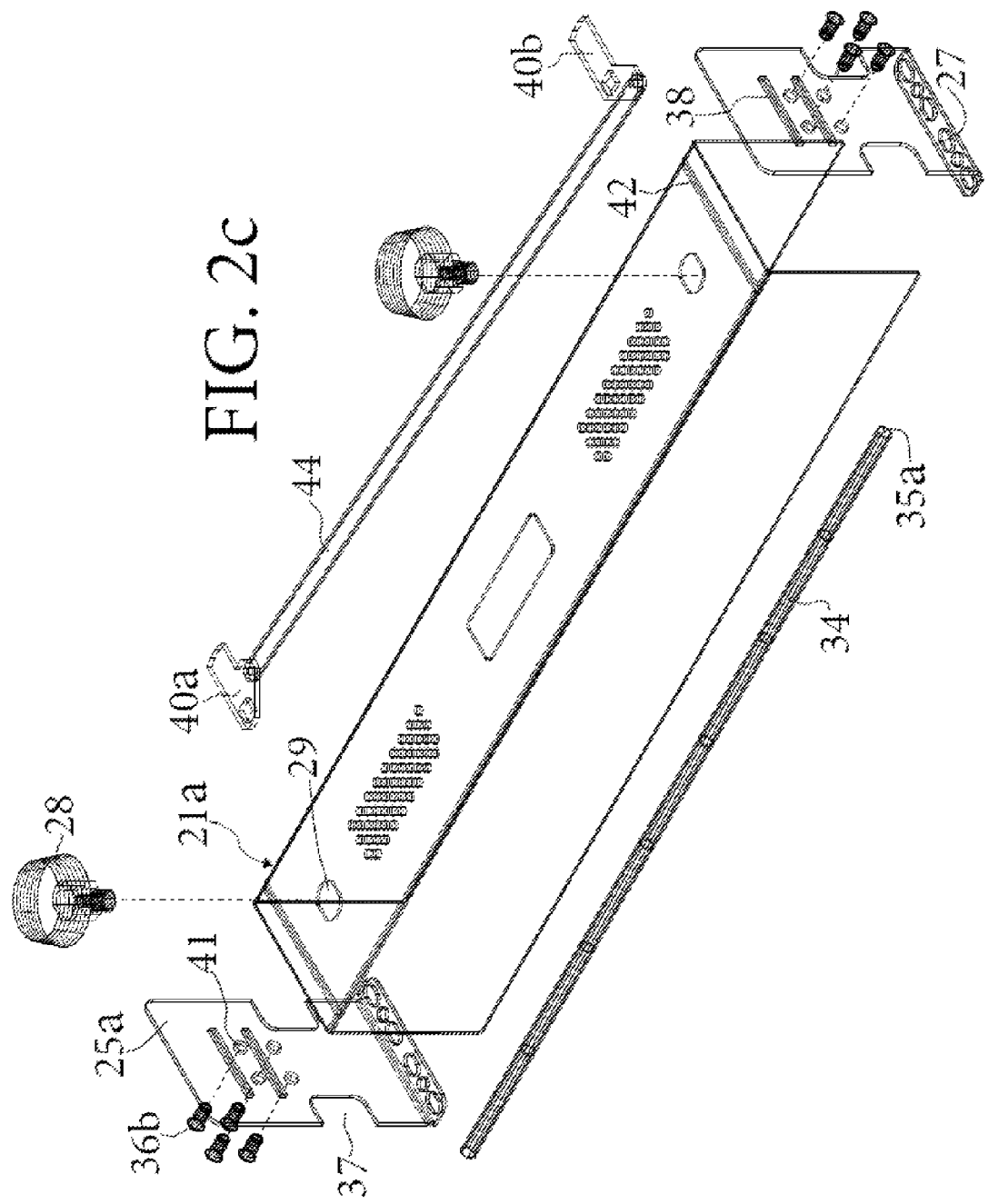

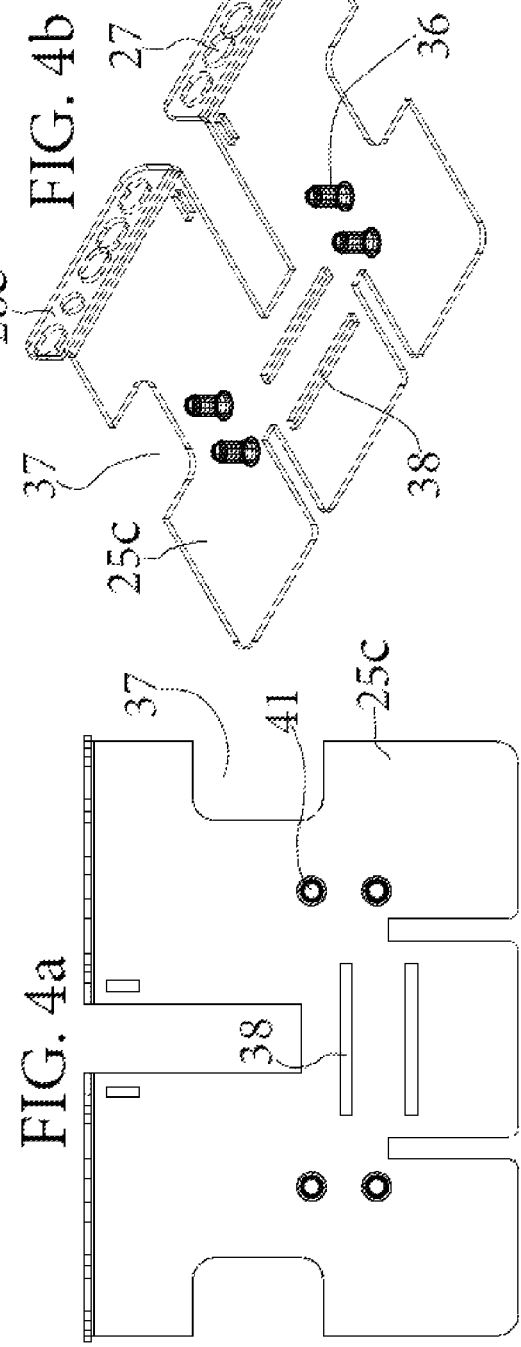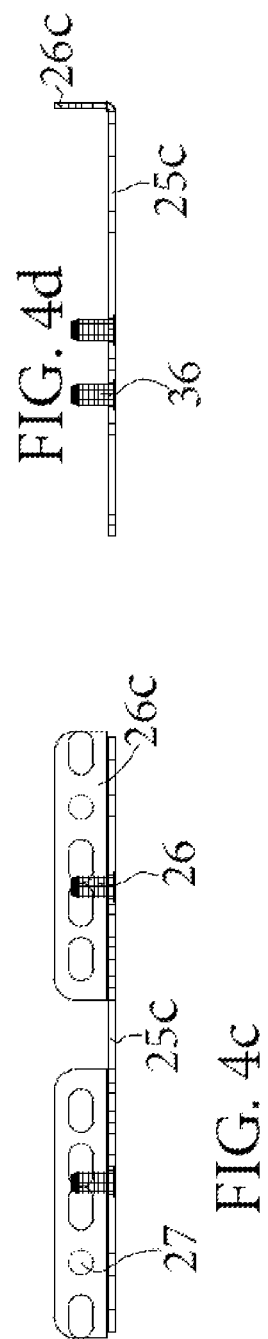

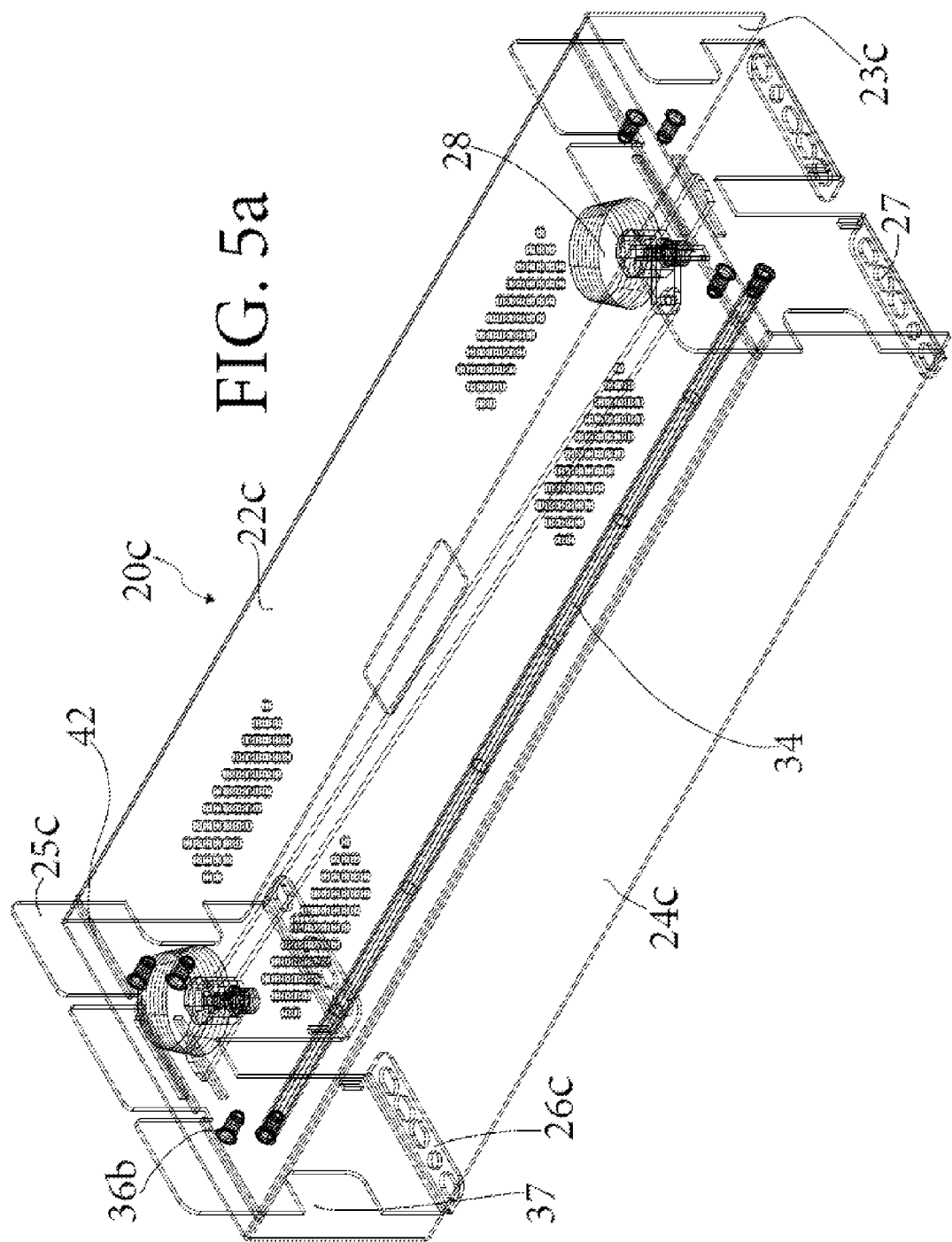

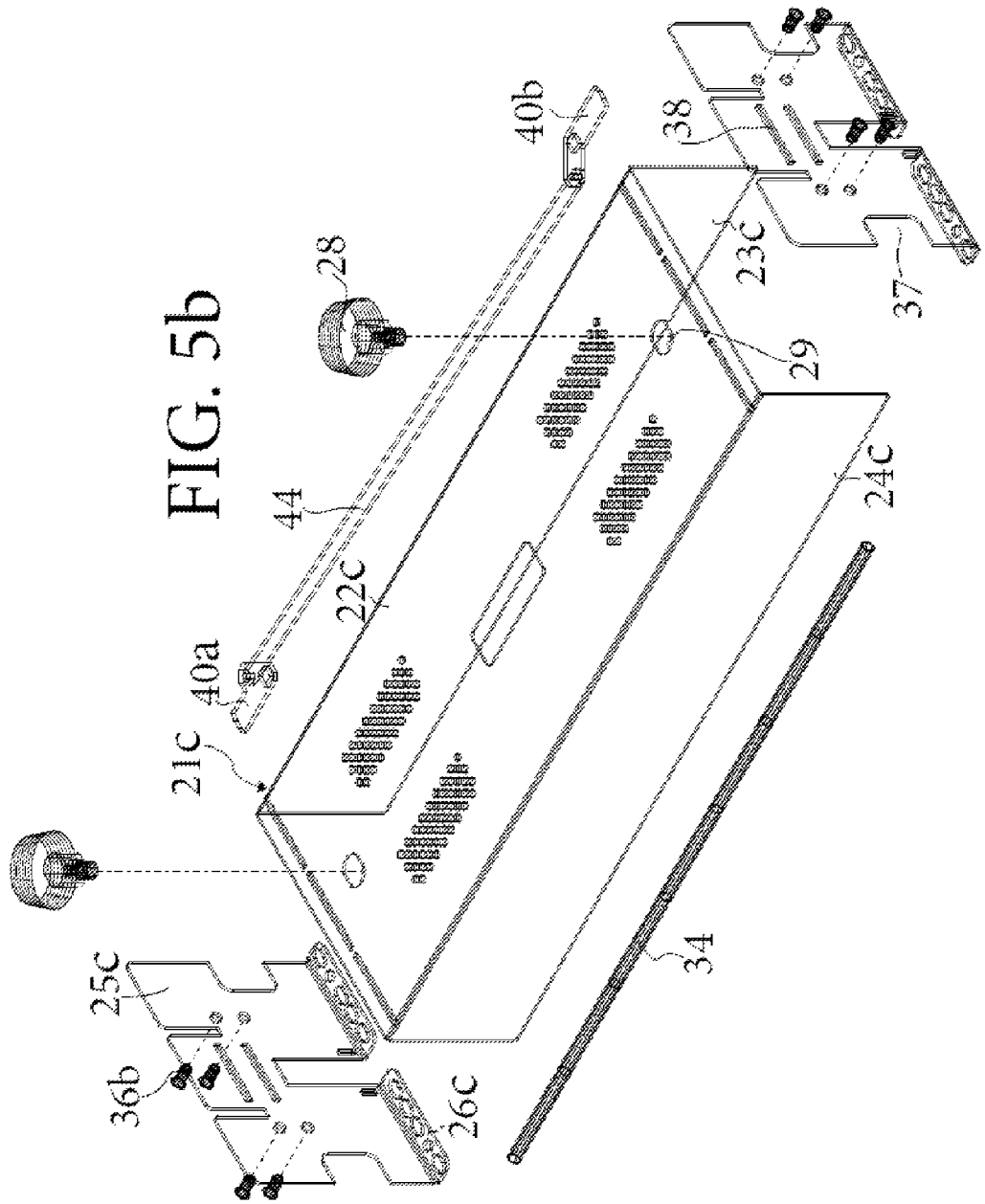

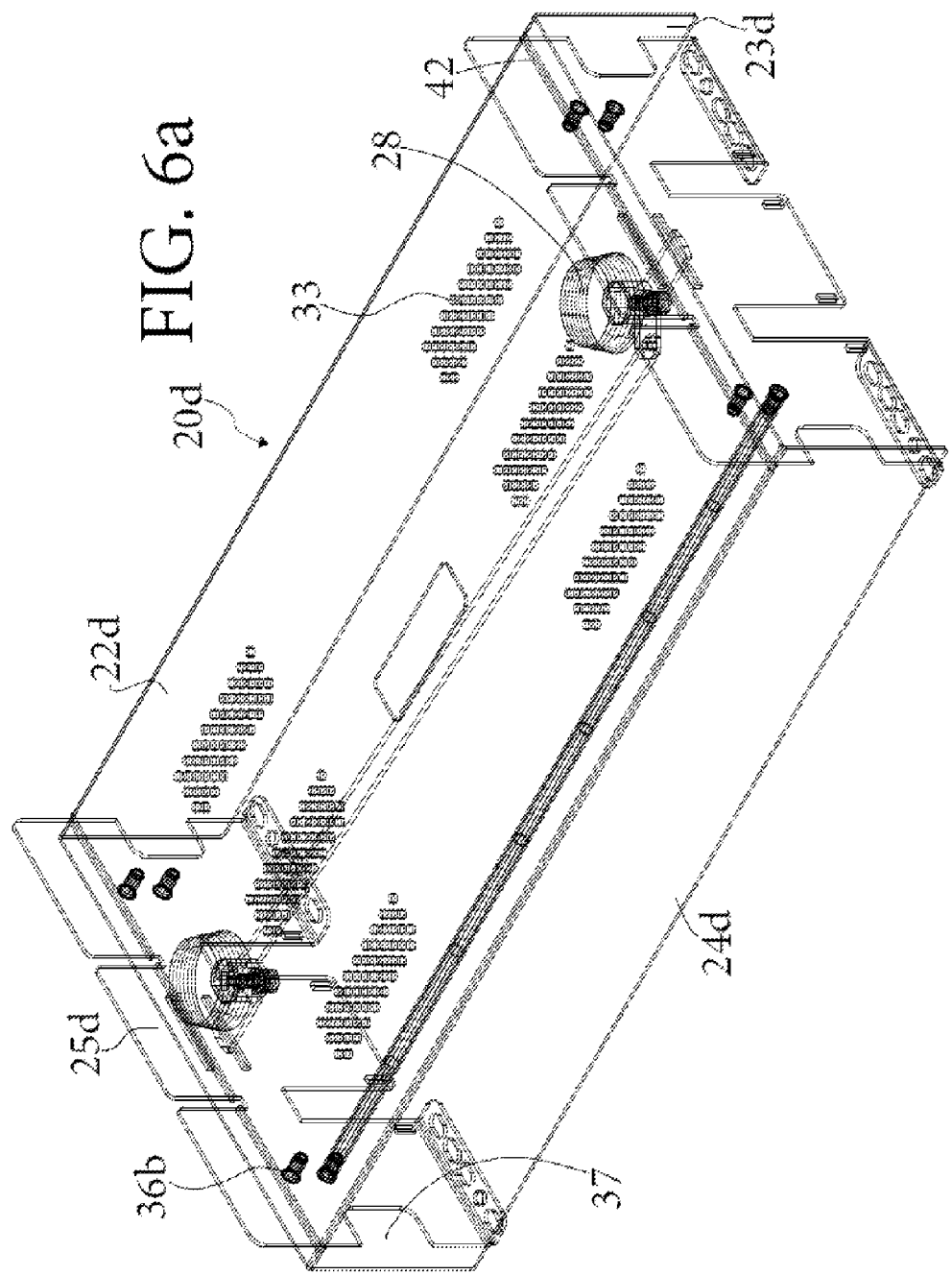

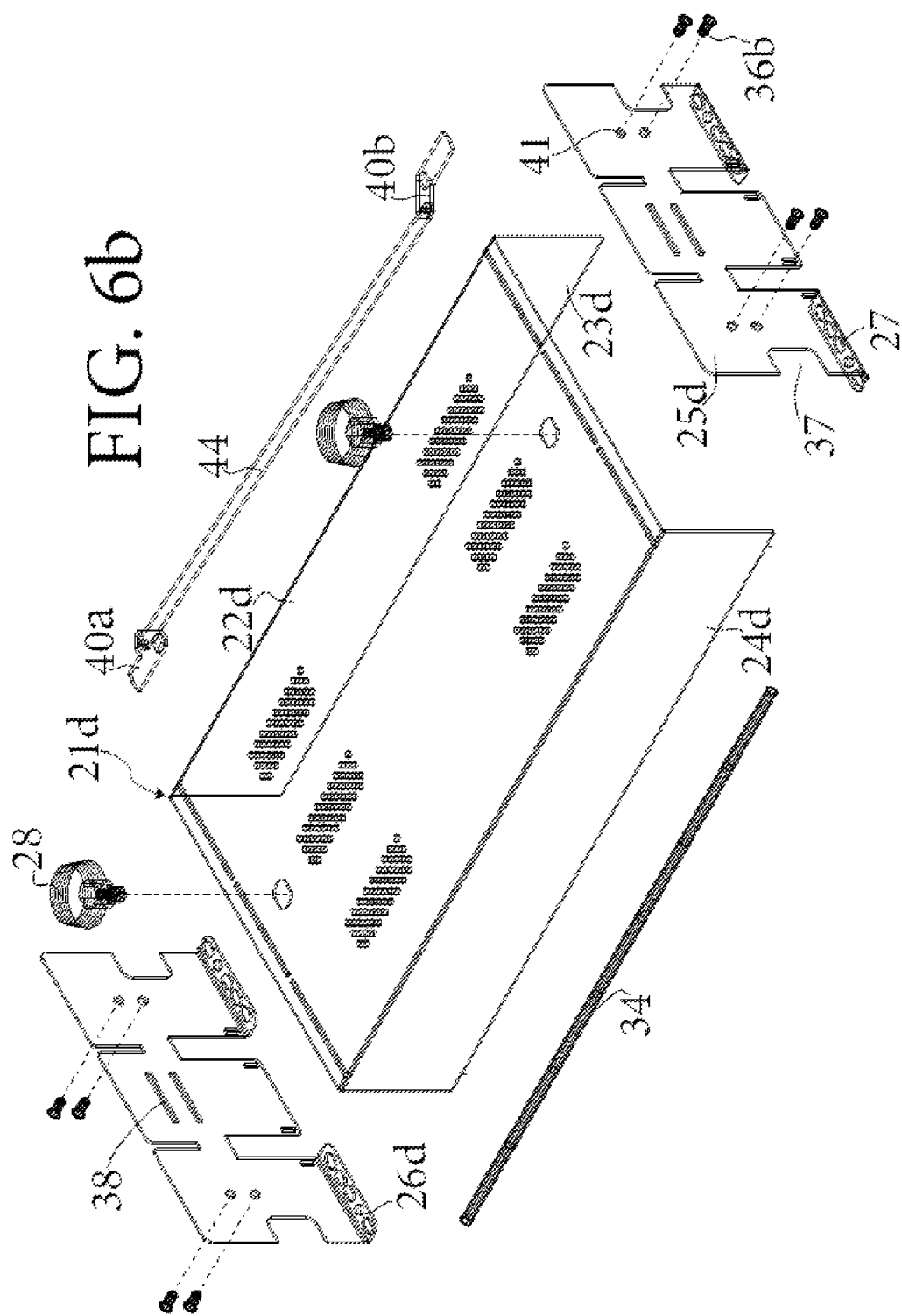

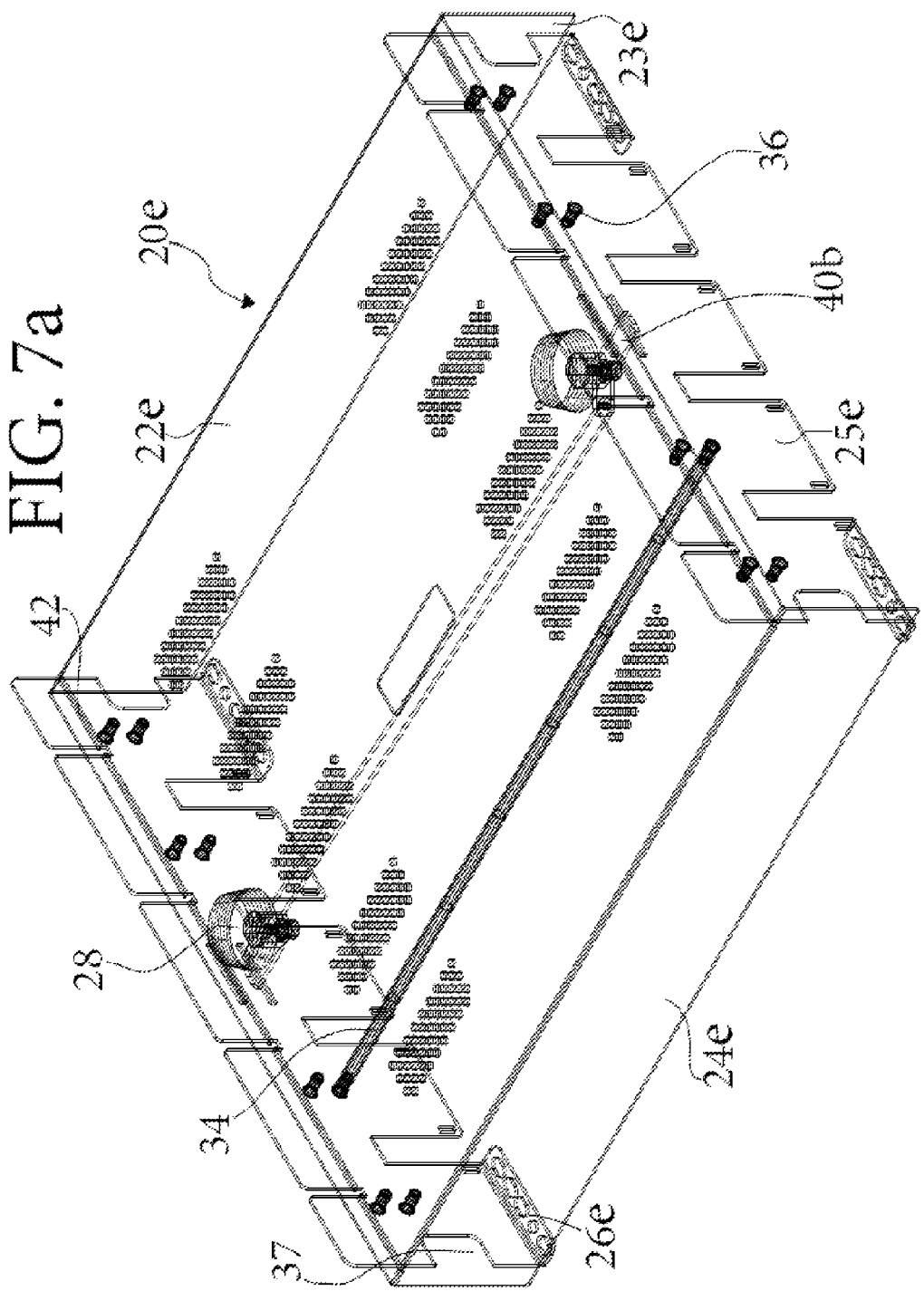

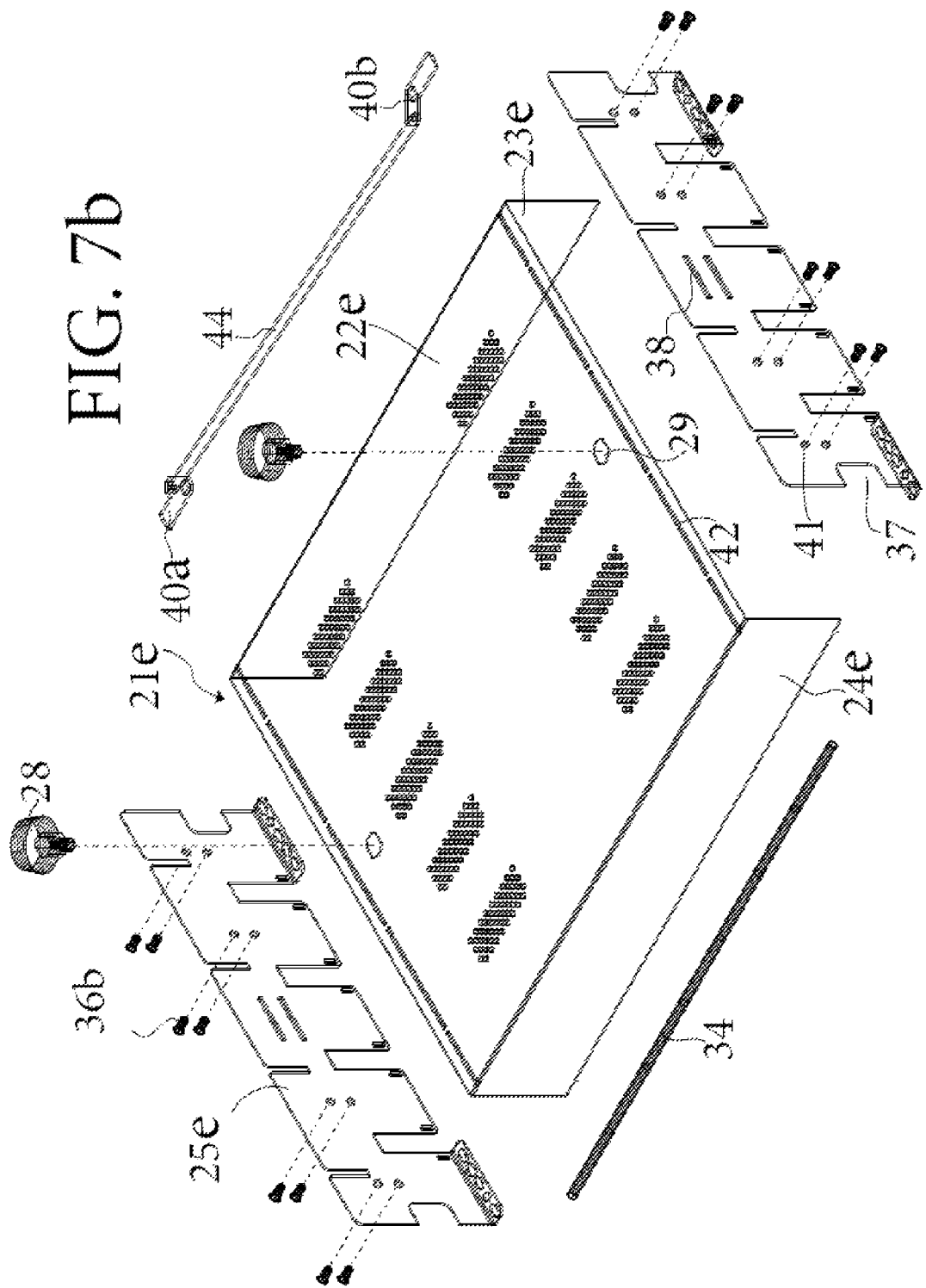

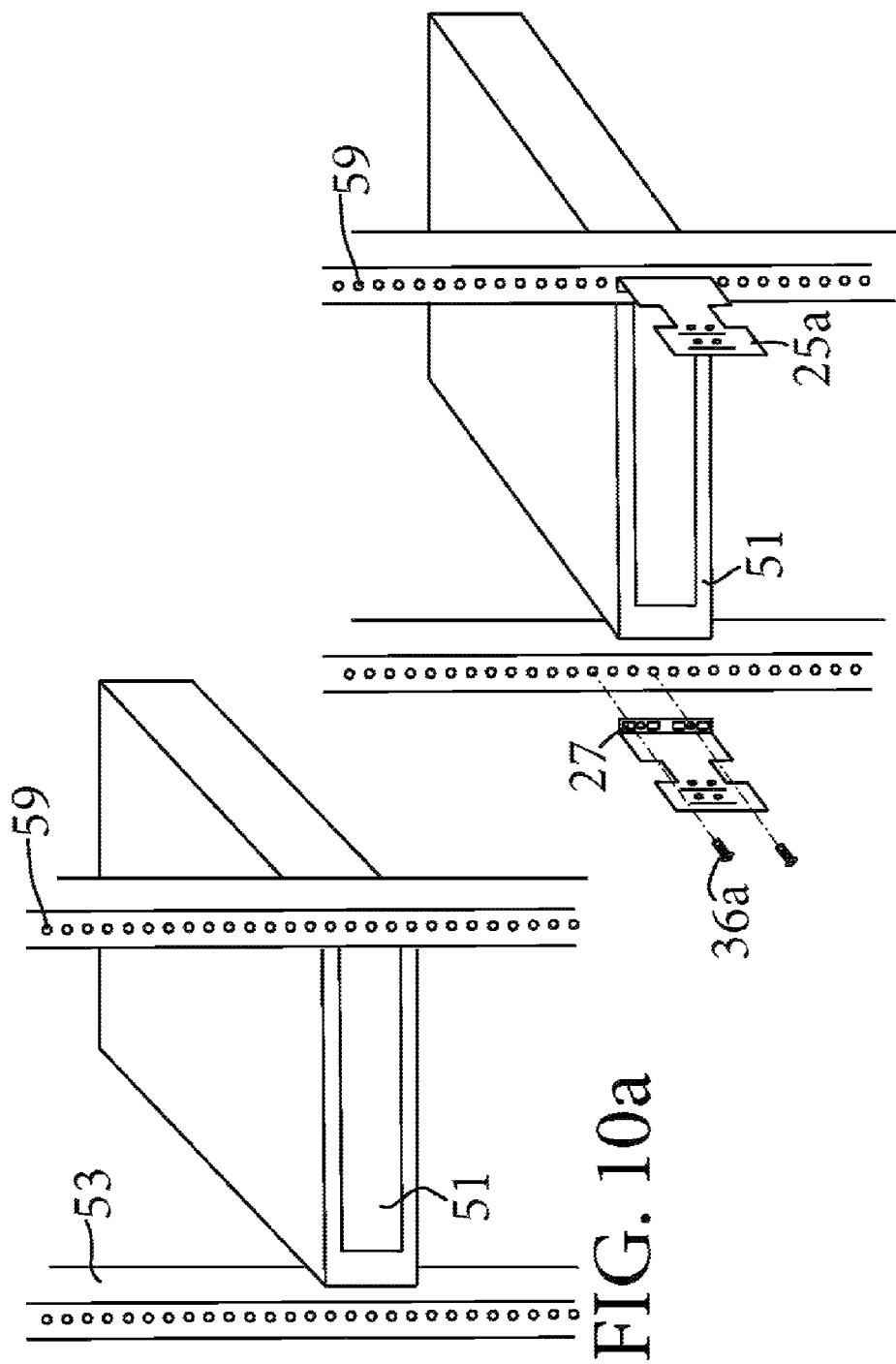

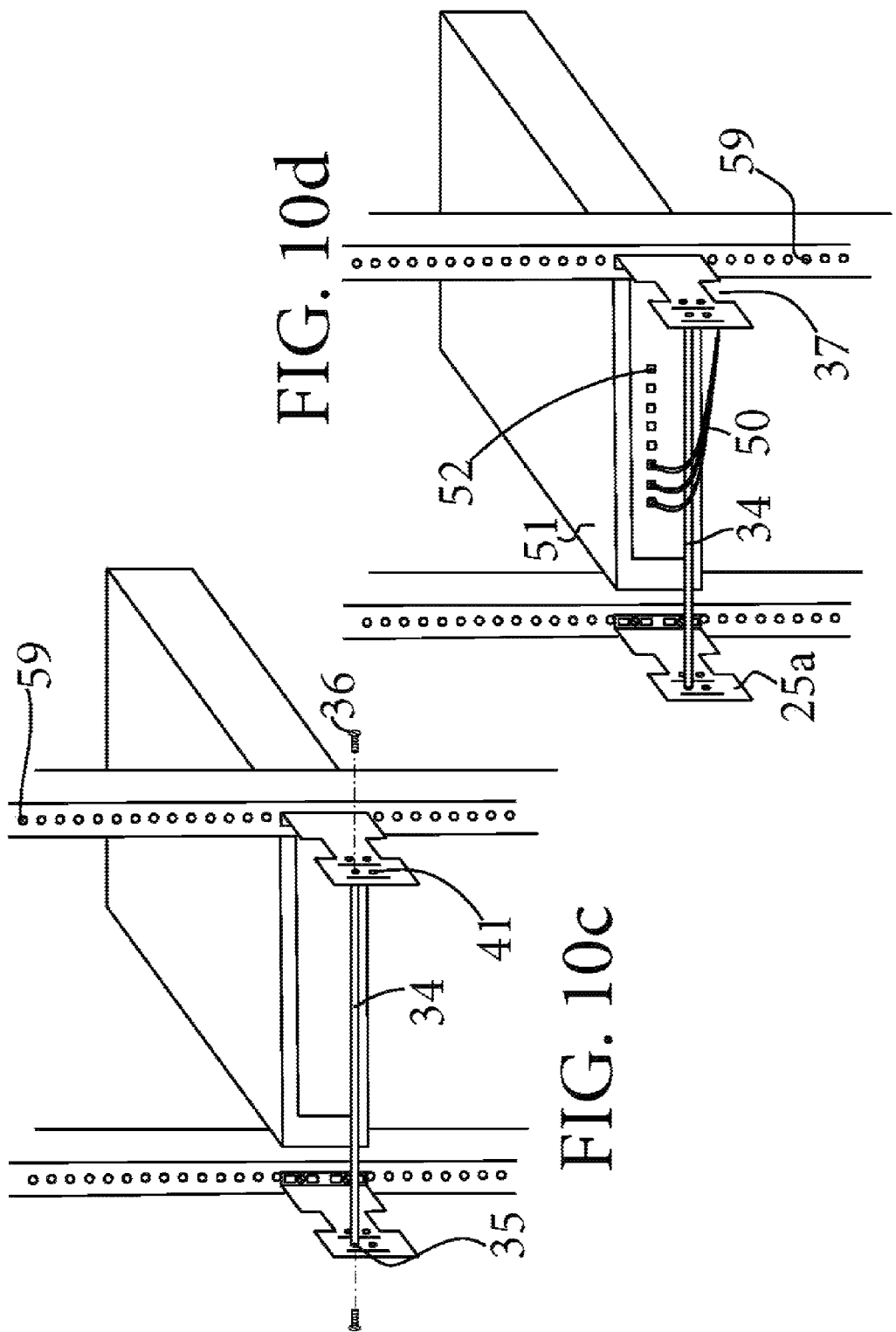

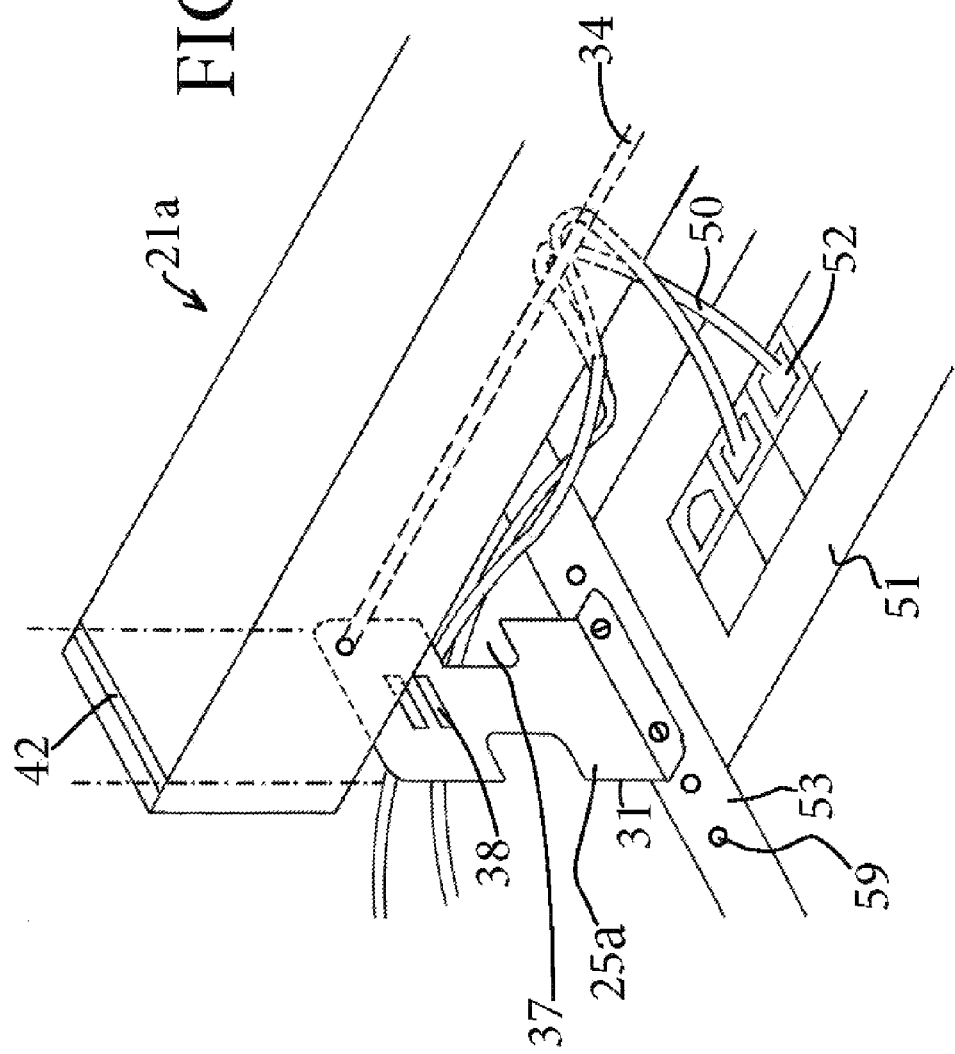

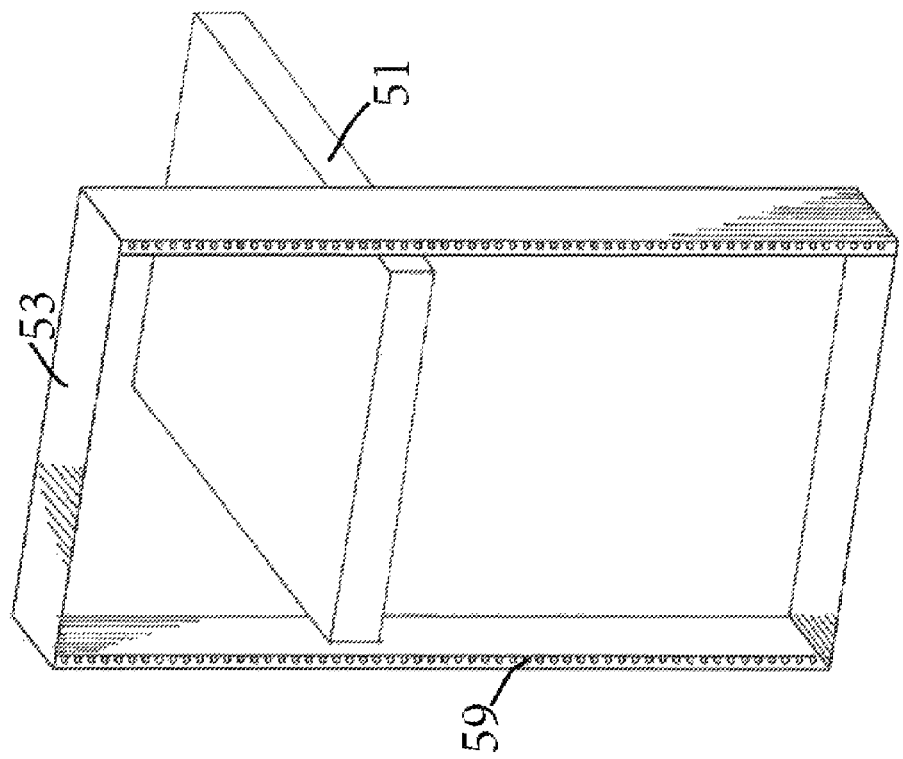
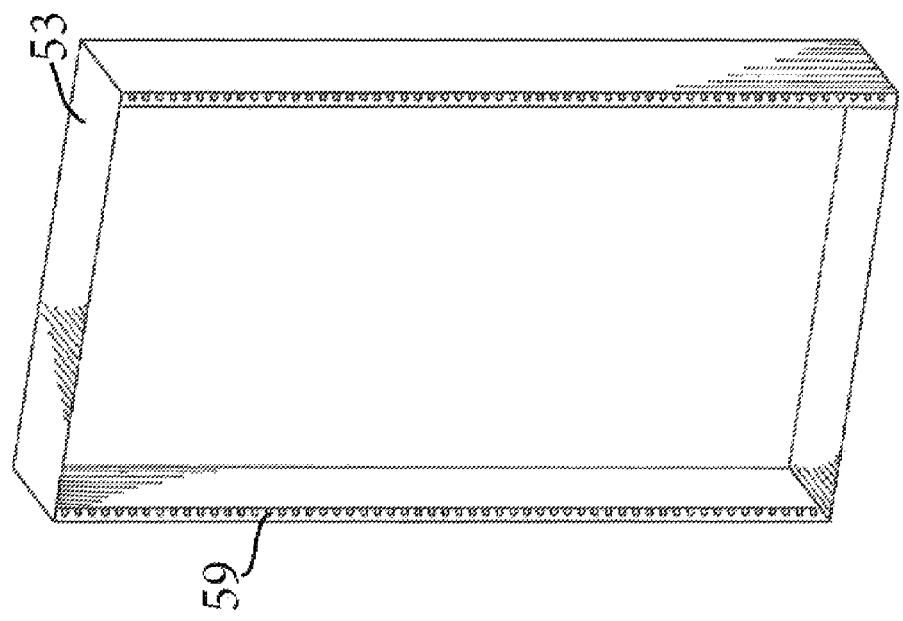

REMOVABLE LOCKING COVER FOR RACK-MOUNTED EQUIPMENT

CROSS-REFERENCE TO RELATED APPLICATIONS

None

FEDERALLY SPONSORED RESEARCH

None

SEQUENCE LISTING

None

BACKGROUND

1. Field of Invention

The present invention relates to conventional rack systems for rack-mounted equipment, and more particularly to a locking cover for rack-mounted equipment.

2. Related Art

The following is a tabulation of some prior art references that appear relevant:

| Patent Number | Kind Code | U.S. Patents Issue Date | Patentee |
|---|---|---|---|
| 7,850,013 | B1 | 2010 Dec. 14 | Kramer et al. |
| 6,925,843 | B1 | 2005 Aug. 9 | Pols Sandhu et al. |
| 8,519,859 | B2 | 2013 Aug. 27 | Forristal et al. |
| 6,927,968 | B2 | 2005 Aug. 9 | Pols Sandhu et al. |
| 7,151,666 | B2 | 2006 Dec. 19 | Song |
| 6,557,385 | B1 | 2003 May 6 | Shih |
| 4,898,009 | A | 1990 Feb. 6 | Lakoski et al. |
| 6,295,204 | B1 | 2001 Sep. 25 | Gibbons et al. |
| 7,104,051 | B2 | 2006 Mar. 21 | Rumney |
| 6,816,370 | B2 | 2004 Nov. 11 | Searby et al. |

| Publication No. | Kind Code | U.S. Patent App. Publication Date | Applicant |
|---|---|---|---|
| 20120056516 | A1 | 2012 Mar. 8 | Chen-Lu Fan |
| 20030233855 | A1 | 2003 Dec. 25 | Pirveysian |

NON-PATENT LITERATURE DOCUMENTS

There are no known non-patent literature documents to the present invention.

For space-saving and logistical purposes, electronic and non-electronic components, e.g., routers, switches, radios, and patch panels, are housed in rack systems—a technique known as "rack mounting." Rack mounting enables multiple devices to be stacked vertically so that the devices have a smaller footprint, and permits simpler cabling among various components. Rack systems are typically constructed with vertically elongated cabinet assemblies with vertically aligned holes at predetermined, standardized distances. These holes allow components to be mounted to the rack system via slots, drawers, or rails. Consequently, rack systems are also highly modular, as rack-mount equipment can easily be installed or removed without modification. Rack systems host a multitude of devices, including telecommunications hardware, computer system components, security systems, Internet servers, network devices, fans, and power modules.

These rack-mounted devices are also often co-located with other devices. Co-location of devices is used to save space, power, cabling, and overall costs. In these co-locations, multiple parties can install equipment in the same rack assembly. Because of their modularity and cable routing features, rack systems pose security risks, particularly in co-located systems or equipment rooms. For example, the fasteners mounting devices to horizontally paired mounting holes can simply be removed or damaged by unauthorized personnel with as little as a screwdriver. Exposed connections are also left susceptible to removal or tampering.

There have been numerous attempts to solve these security risks, but all suffer from one or more disadvantages:

(a) Housing rack systems in a room or behind locked doors (for example in U.S. Pat. No. 8,519,859 (2013)) and cabinets. While usable for isolated locations, secure rooms are not feasible in applications where multiple parties and vendors must access rack equipment. Secure rooms also fail to protect individual devices. For example, even an employee authorized to be in a secure room may accidentally remove connections or tamper with a sensitive device. Or, an authorized employee may need access to Device X but not Device Y, yet, in actuality, has access to both in a secure room.

(b) Securing rack equipment with a cable. While this option deters theft, it does not limit access to exposed rack-mounted devices or connections. Thus, many of the same drawbacks of having a secure room are still present.

(c) Hinged covers for rack-mount devices (for example in U.S. Pat. No. 7,152,936 (2006)). While hinged covers for rack-mounted components may be able to address some of the co-location problems mentioned above, for example by having covers secure individual devices, as in U.S. Pat. No. 6,816,370 (2004), there are many applications in which hinged covers simply cannot be employed. Because many rack systems are placed in close proximity to other racks or have access doors, hinged covers will not function where there is not enough room for the cover to pivot within the rack system.

(d) Locking drawers or trays with locking covers (for example in U.S. Pat. No. 6,925,843 (2005)). These systems involve removing and installing rack equipment within the tray or drawer, and locking the font of the drawer to prevent the device from being removed. While locking drawers do help protect individual devices and do not necessarily require hinges, their installation does require a disruption in service and additional rack space. Additionally, existing systems like U.S. Pat. No. 6,295,843 (2005) do not preclude access to installed components or their connections, especially if the rack device takes up multiple "rack units."

(e) Bar devices that lock either vertically or horizontally to rack mounting holes (for example in U.S. Pat. No. 7,850,013 (2010), and U.S. patent application 20030233855 (2003)). Such bars are secured over the mounted equipment to prevent the removal of the equipment. A major drawback to these designs is that they do not completely prevent access to the equipment or the connections; unauthorized personnel may still be able to tamper with or damage installed equipment even when the bars are installed and locked in place.

Advantages of the Present Invention

Accordingly, there are numerous problems with existing forms of rack security devices. Several advantages of one or more of the present aspects are as follows: to provide a security method and mechanism that can be easily installed over existing equipment without disrupting service; that can prevent both the theft of, and access to, rack-mounted devices and their connections; that can isolate specific devices; and that can be used in rack-systems that are spaced too tightly for other existing security mechanisms. Other advantages of one or more aspects of my invention will be apparent from a consideration of the drawings and ensuing description.

SUMMARY OF THE INVENTION

The following briefly describes several embodiments of my locking cover assembly. In accordance with one particular embodiment of my locking cover assembly, mounting brackets are fastened to a conventional rack system. A front cover mates with the mounting brackets by sliding over the mounting brackets through two vertical slits in the front cover. When installed, the front cover and mounting brackets form a five-sided cover over installed rack-mounted equipment.

The locking cover assembly has at least one attached locking mechanism and numerous ventilation holes that are small enough to prevent unauthorized access, but are sufficient in size to allow proper airflow to rack-mounted devices. The front cover also has a front face, a solid lower panel, and a solid upper panel. These three sides protect the rack-mounted equipment from the front, topside, and underside. The mounting brackets on both sides of the front cover prevent side access to rack-mounted equipment, while allowing cables to be routed outside the locking cover assembly via cable ports in each mounting bracket. The mounting brackets interface with cams, which are part of locking mechanisms integrated in the front cover, when the cams are rotated or slid into slots cut into the mounting brackets. There are several slots in each mounting bracket, which allow the user to adjust the depth of the front cover relative to the rack-mounted devices. When locked, the front cover and mounting brackets are thus formed integral, forming the locking cover assembly. Additionally, when the locking cover assembly is installed and in the locked position, it prevents access to the rack-mount fasteners, the rack unit aperture, the rack-mounted device, and the device's connections. When unlocked, the front cover slides off completely and allows unobstructed access to the rack-mounted device and any connections running to or from the device, while the mounting brackets remain attached to the rack system.

In one embodiment of my locking cover assembly, two mounting brackets are secured to a standard rack. The mounting brackets attach directly over rack-mounted devices or conventional equipment ears, with rack interface tabs facing inward, using conventional rack channel fasteners. The mounting brackets are slightly lower in height relative to standard rack-mounted devices, have a depth of approximately 5 inches (from the rack-mounted device towards the user and face of the front cover), and have a plurality of holes to fasten to rack systems. The brackets can attach to both standard EIA rack systems and one-inch rack spacing systems. Cables and other connections are fed through ports in the mounting brackets. In one aspect of my locking cover assembly, a tie bar with female threaded ends is sandwiched between the two mounting brackets, and is secured to each mounting bracket using a threaded fastener. The tie bar can secure cabling to the bar using, for example, cable ties, in order to prevent unauthorized personnel from removing connections by pulling on exposed cables located outside of the locking cover assembly.

In one or more embodiments of my locking cover assembly, the front cover has a width of 20 inches (slightly greater than that of a standard rack, which is about 19 inches wide, mounted ear-to-ear) and a height equal to that of two conventional EIA rack units ("RUs"), about 3.5 inches high. There are other embodiments of the locking cover assembly, however, where the height of the mounting brackets and front cover are changed to cover other rack spacings (for example, 1-RU, 4-RU, 6-RU, or 10-RU). In another embodiment, the front cover's width covers the wider 23-inch rack-mounted devices. The front cover and the mounting brackets could be made of any materials, including plastic or metal, which would sufficiently protect rack components by way of being suitably strong and tamper resistant. The front cover and mounting brackets can also be different sizes.

In at least one aspect of my locking cover assembly, the front cover is locked to the rack system. The cams turn or slide to engage with the cam-receiving slots in the mounting brackets, preventing the front cover and brackets from being moved in any ordinate direction. When the front cover is attached and locked, an unauthorized party cannot remove the device because the front cover and mounting brackets prevent access to the fasteners securing rack equipment to the rack system, and equipment ears. Access to connections and to the covered rack-mounted device is also precluded when the front cover and mounting brackets are installed and locked.

The number, type, and location of the locking mechanisms can vary. In one embodiment of my locking cover assembly, there are two locking mechanisms, with one mechanism attached at either side of the front cover's face. When two or more locking mechanisms are employed, each locking mechanism has a single-cam device attached to the lock cylinder. In one aspect of the locking cover assembly with two locking mechanisms, the lock cams are attached to each other with a bar, preventing the cams from rotating independent of each other. This method allows for the use of two different combinations or two different keys as an added layer of security.

In one embodiment of my locking cover assembly, the lock cams are not attached to each other, so each lock can be engaged/disengaged independently.

In one embodiment of my locking cover assembly, there is a single locking mechanism in the front cover, which is a dual-cam device in a conventional gang lock locking arrangement. The front locking mechanisms can be a plurality of devices, including keyed cylinder locks, combination locks, or keyed tumbler locks.

My locking cover assembly invention is susceptible to various modifications and alternative forms. Specific embodiments of my invention are shown by way of example in the drawings, and in the detailed descriptions provided herein. It will be understood, however, that the descriptions of specific embodiments are not intended to limit the invention to the particular forms found below; to the contrary, the intention is to cover all modifications and alternative forms of the locking cover assembly falling within the spirit and scope of the invention as defined herein.

DRAWINGS

Figures

In the drawings, related figures share the same number but have different alphabetic suffixes.

FIG. 1 shows one embodiment of the 2-RU locking cover assembly.

FIGS. 2a to 2d show various aspects of the 2-RU locking cover assembly, including an assembled view, an exploded view, and embodiments with different locking mechanism configurations.

FIG. 3 shows one embodiment of the 1-RU locking cover assembly.

FIGS. 4a to 4e show various aspects of the mounting brackets.

FIGS. 5a to 5b show various aspects of the 4-RU locking cover assembly, including an assembled view and an exploded view.

FIGS. 6a to 6b show various aspects of the 6-RU locking cover assembly, including an assembled view and an exploded view.

FIGS. 7a to 7b show various aspects of the 10-RU locking cover assembly, including an assembled view and an exploded view.

FIGS. 8a to 8d show different embodiments of dual-cam locking mechanisms in a 2-RU front cover.

FIGS. 9a to 9d show different embodiments of single-cam locking mechanisms in a 2-RU front cover.

FIGS. 10a to 10e show the operation and installation process for a 2-RU locking cover assembly over a rack-mounted device.

FIG. 11 shows how the cables from a rack-mounted device can be attached to the tie bar and routed through the locking cover assembly.

FIGS. 12a to 12b show the locking mechanism in a synchronized, linked-lock design.

FIGS. 13a to 13b show a traditional rack system and an installed rack-mounted device.

REFERENCE NUMERALS 20a. 2-RU locking cover assembly
20b. 1-RU locking cover assembly
20c. 4-RU locking cover assembly
20d. 6-RU locking cover assembly
20e. 10-RU locking cover assembly
21a. 2-RU front cover
21b. 1-RU front cover
21c. 4-RU front cover
21d. 6-RU front cover
21e. 10-RU front cover
22a. Face of 2-RU front cover
22b. Face of 1-RU front cover
22c. Face of 4-RU front cover
22d. Face of 6-RU front cover
22e. Face of 10-RU front cover
23a. Upper plane of 2-RU front cover
23b. Upper plane of 1-RU front cover
23c. Upper plane of 4-RU front cover
23d. Upper plane of 6-RU front cover
23e. Upper plane of 10-RU front cover
24a. Lower plane of 2-RU front cover
24b. Lower plane of 1-RU front cover
24c. Lower plane of 4-RU front cover
24d. Lower plane of 6-RU front cover
24e. Lower plane of 10-RU front cover
25a. 2-RU mounting bracket
25b. 1-RU mounting bracket
25c. 4-RU mounting bracket
25d. 6-RU mounting bracket
25e. 10-RU mounting bracket
26a. Rack interface tab on 2-RU mounting bracket
26b. Rack interface tab on 1-RU mounting bracket
26c. Rack interface tab on 4-RU mounting bracket
26d. Rack interface tab on 6-RU mounting bracket
26e. Rack interface tab on 10-RU mounting bracket
27. Mounting bracket fastener hole
28. Locking mechanism
29. Opening for insertion of locking mechanism into front cover
31. Height-wise side of mounting bracket (2-RU)
32. Depth-wise side of mounting bracket (2-RU)
33. Ventilation holes
34. Tie bar
35. Threaded end of tie bar
35a. Non-threaded end of tie bar
36. Conventional threaded fastener for tie bar
36a. Conventional threaded mounting fastener
36b. Conventional automotive push-in retention fastener
37. Cable-routing ports
38. Cam-receiving slots
39. Cams in dual-cam, gang lock design
39a. Cams in non-linked design
40a. Acute angled cam in linked-lock design
40b. Obtuse angled cam in linked-lock design
41. Tie bar mounting hole in mounting bracket
42. Bracket-receiving slit in front cover
43. Cam guides
44. Bar-cam attachment in linked-lock design
50. Cables from rack-mounted device
51. Conventional rack-mounted device
52. Connections from rack-mounted device
53. Conventional rack system
55. Tubular keyed locking mechanism
56. Slotted keyed locking mechanism
57. Combination locking mechanism
58. Keypad locking mechanism
59. Rack system holes

BRIEF DESCRIPTION OF THE DRAWINGS

The aforementioned objects, features, and technical advantages of the present invention will be better understood with regard to the following description of particular embodiments, as illustrated in the accompanying drawings.

DETAILED DESCRIPTION OF SPECIFIC EMBODIMENTS

The invention discloses an apparatus for securing rack-mounted equipment and their connections by installing a locking cover assembly over rack-mounted devices. Herein, the terms "rack," "rack system," and "rack-mounted" are used in the conventional manner to describe a frame or cabinet in which rack-mounted devices and equipment are supported, as well as the manner in which those devices are supported. The rack-mounted devices can be any device, including but not limited to telecommunications equipment, security systems, computer components, computer servers, mass storage devices, and musical instrument processing equipment.

Detailed Description of First Embodiment

Figure 1:
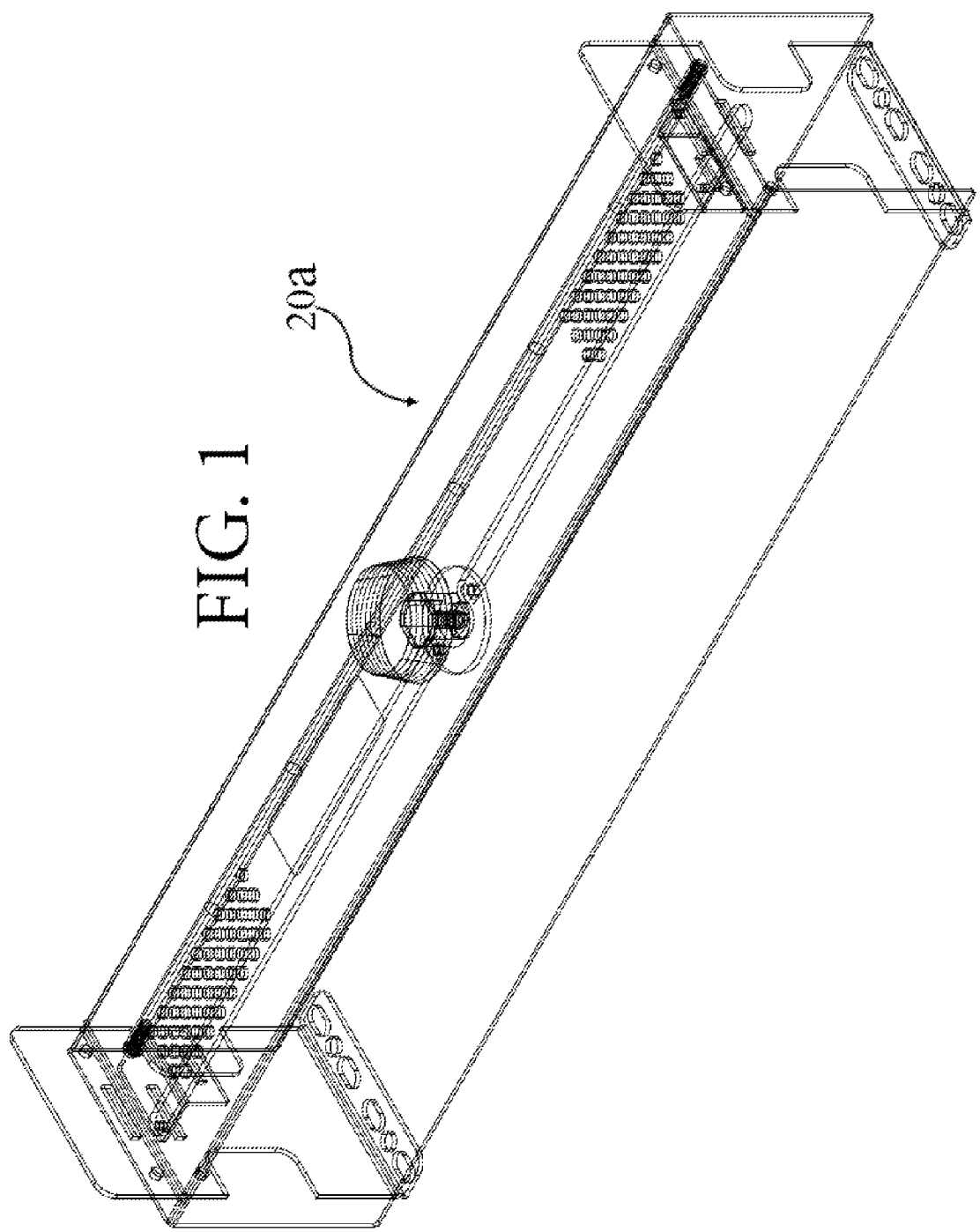

FIGS. 1-2c

Referring to the figures ("FIGS.") above, and specifically to FIGS. 1 through 2c, an example locking cover assembly 20a is illustrated as the first embodiment of my invention. In this first embodiment, the front cover 21a and mounting brackets 25a are assembled to form a five-sided cover (the "locking cover assembly" 20a) to secure rack-mounted devices. The front cover 21a slidably mounts over two mounting brackets 25a that mount to each side of a conventional rack system 53 (FIGS. 13a and 13b) or to traditional rack mounting ears (not pictured). Traditional rack mounting ears often use removable threaded fasteners 36*a*, as shown in FIG. 10*b*, such as conventional bolts, to attach rack-mounted equipment 51 to conventional rack systems (also referred to as a "rack assembly") 53.

In conjunction with the mounting brackets 25*a* and rack interface tabs 26*a*, the locking cover assembly 20*a* prevents access to mounting fasteners 36*a*, as well as access to the rack-mounted devices 51, the device's connections 52, and the cables 50 running to and from rack-mounted devices (as shown in FIGS. 10*a* through 10*d*) without requiring service interruption or reinstallation of rack-mounted equipment 51.

In this first embodiment, as shown in FIGS. 2*a* through 2*d*, a two-rack-unit ("RU") locking cover assembly 20*a* can be installed over a rack-mounted device 51 that is mounted in a traditional 19-inch rack assembly 53 (as seen in FIGS. 10*a* through 10*d*). The main function of the locking cover assembly 20*a* is to protect the rack-mounted device 51 from unauthorized access. The locking cover assembly 20*a* accomplishes this by covering the rack-mounted device 51 and its connections 52 from all sides. The locking cover assembly's 20*a* front cover 21*a* has three sides—the face 22*a*, a top plane 23*a*, and a bottom plane 24*a*. The mounting brackets 25*a* make up the other two sides of the locking cover assembly 20*a*, and provide protection for the rack-mounted device 51 from the left and right sides.

FIGS. 2*a* through 2*c* and FIG. 4*e* show the mounting brackets 25*a* in the first embodiment. The 2-RU mounting brackets 25*a* are made of twelve- to fourteen-gauge steel. The height-wise sides 31 of the mounting brackets 25*a* are substantially equal to the height of the front cover 21*a*. In the first embodiment, the mounting brackets 25*a* are approximately 3.3 inches in height 31, and are five inches in depth 32, extending from the rack system towards the user. The mounting brackets 25*a* are L-shaped brackets, each having a rack interface tab 26*a* extending 90-degrees from the depth-wise side 32 of the mounting bracket 25*a*. The rack interface tabs 26*a* face the center of the rack system 53, align with the rack system holes 59 (seen in FIGS. 10*a* through 11, 13*a*, 13*b*) and are approximately 0.8 inches in width. Each rack interface tab 26*a* has a plurality of fastener holes 27 for securing the mounting brackets 25*a* to the rack system using conventional threaded mounting fasteners 36*a*. Referring to FIGS. 2*a* through 4*e*, the mounting brackets 25*a* also have a plurality of holes through which to attach a conventional tie bar (hereinafter "tie bar") 34, as well as a plurality of cam-receiving slots 38. The tie bar 34 is used to secure cables 50 from the rack-mounted equipment 51.

Referring again to FIGS. 2*a* through 2*c*, the face of the front cover 22*a* houses the locking mechanism 28 to lock the front cover 21*a* to the mounting brackets 25*a*, and subsequently to the rack system 53. When locked to the mounting brackets 25*a*, the sides of the rack-mounted device 51 are also protected from outside access. In order to cover the entire conventional 19-inch rack-mounted device 51, the length of the front cover 21*a* is approximately 20 inches wide (50.8 cm). To cover the entire aperture of the rack unit, this first embodiment of the front cover 21*a* is 3.5 inches high (8.89 cm), sufficient to cover a conventional 2-RU rack-mounted device. The face of the front cover 22*a* also houses ventilation holes 33 that allow for adequate airflow to rack-mounted devices 51 while preventing access to cables 50, connections 52, or the rack-mounted device 51 underneath the front cover 21*a*.

Figure 4E:
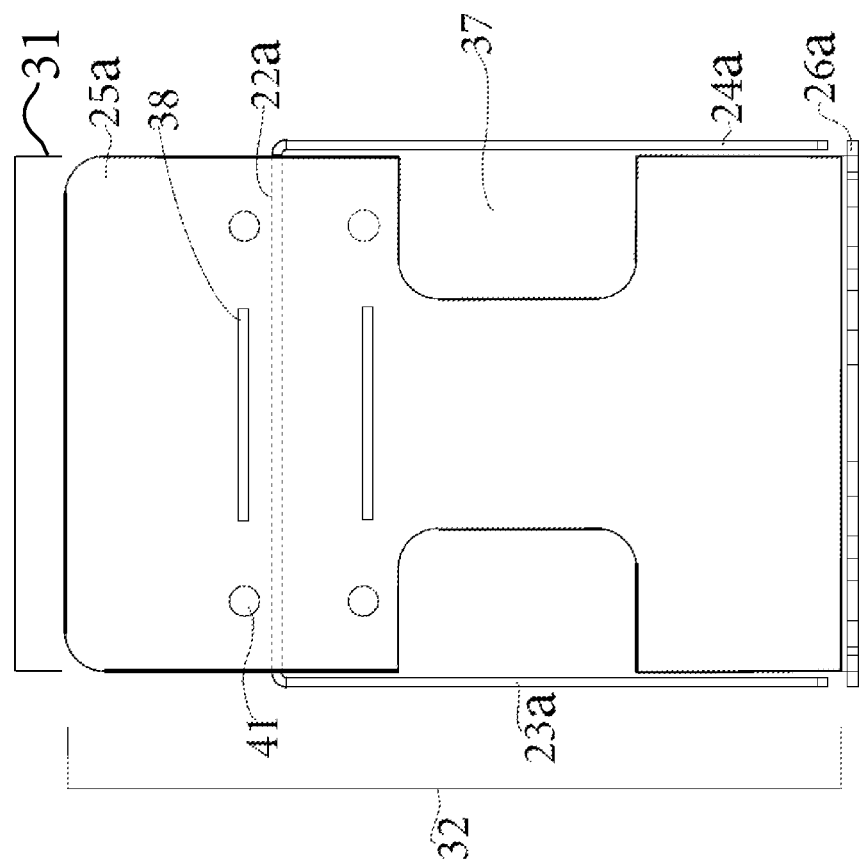
Figure 8A:
Figure 8B:
Figure 8D:
Figure 8C:
Figure 9A:
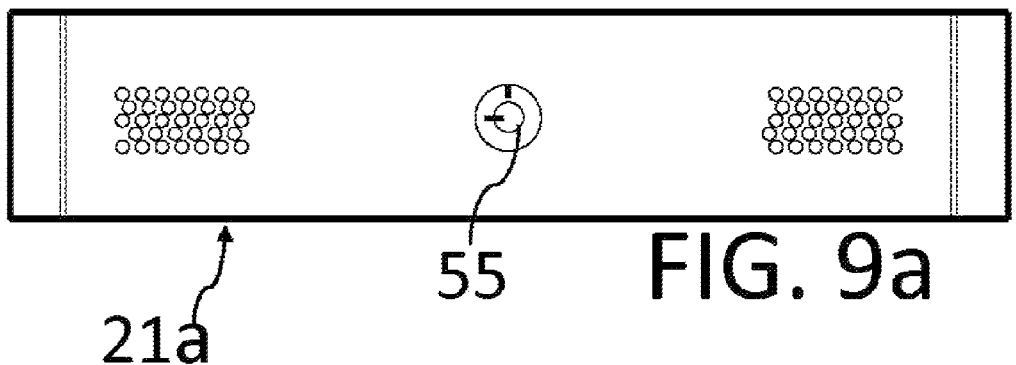
Figure 9B:
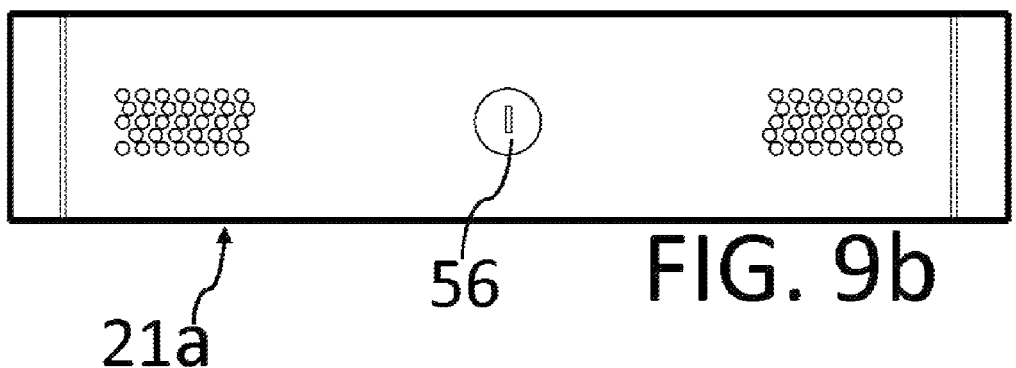
Figure 9D:
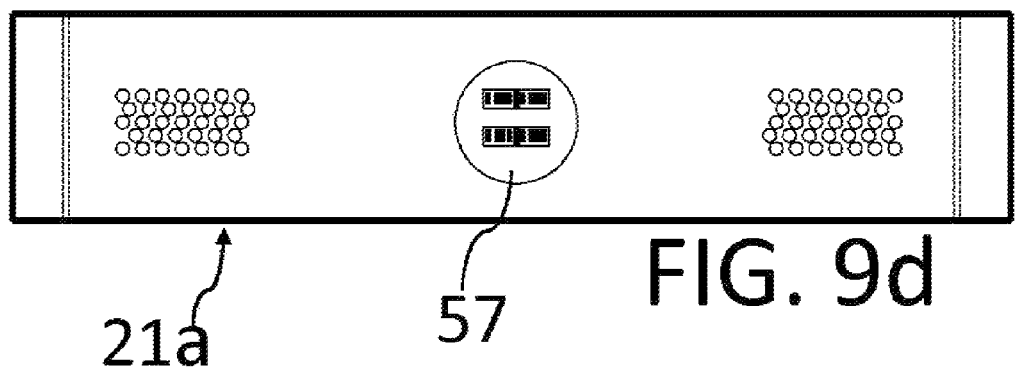
Figure 9C:
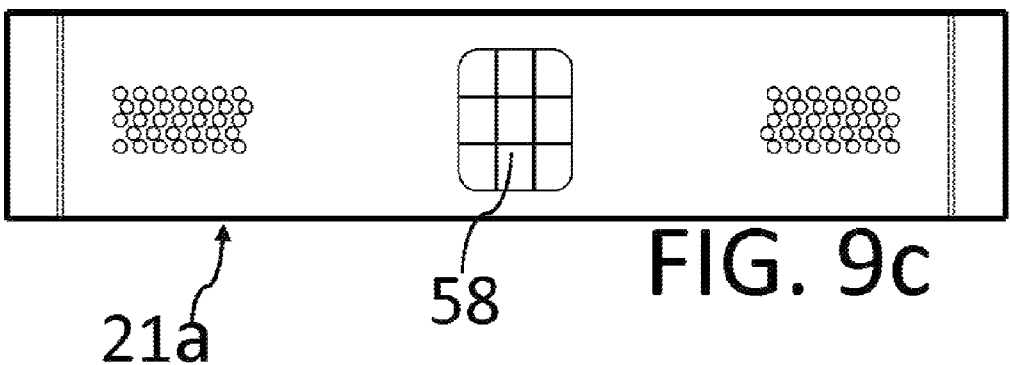

My front cover 21*a* in the first embodiment, as shown in FIGS. 2*a* through 2*c*, mates with mounting brackets 25*a* that are 3.3 inches (8.38 cm) high 31 (for a standard 2-RU device), and extend out from the rack system 53 (toward the user) 5 inches (12.065 cm) 32, as shown in FIG. 4*e*.

Referring to FIG. 4*e*, each mounting bracket 25*a* has two cable routing ports 37. The cable routing ports 37 are located on the depth-wise sides 32 of the mounting brackets 25*a*. Cables 50 and other internal connections 52 from rack-mounted devices 51 can be fed through any cable routing port 37. The cable routing ports 37 permit the locking cover assembly 20*a* to be installed over rack systems that require cables 50 to be routed outside of the locking cover assembly 20*a* (see e.g., FIG. 11). If desired, the user can run cabling through conduit for an added layer of security when it is necessary to route cables 50 outside of the locking cover assembly 20*a*.

Referring now to FIGS. 2*a* through 2*c*, the width of the two bracket-receiving slits 42 in the front cover 21*a* are sufficient for the front cover 21*a* to slide over the mounting brackets 25*a*. The mounting brackets 25*a* also have one or more cam-receiving slots 38, each parallel to one another. The cam-receiving slots 38 are also parallel to the front cover face 22*a*. Multiple cam-receiving slots 38 allow for an adjustable depth of the front cover 21*a* in relation to the rack-mounted equipment 51. Such an adjustment allows for the use of the locking cover assembly 20*a* with rack-mounted devices 51 of different sizes, mounting positions, and cabling configurations. The cam-receiving slots 38 also allow the cams 39 from the locking mechanisms 28 to rotate or slide into and out of the mounting brackets 25*a* to lock the front cover 21*a* to the mounting brackets 25*a*.

FIGS. 1, 2*a*, and 2*b* show one embodiment in which the locking cover assembly 20*a* has one locking mechanism 28. In this embodiment, a single locking mechanism is centrally located in the face of the front cover 22*a*. In this embodiment, the locking mechanism 28 is a dual cam lock. The cams 39 in this design run parallel to the face of the front cover 22*a* and rest in cam guides 43, which are attached to the inside of the face of the front cover 22*a*.

Still referring to FIGS. 2*a* and 2*b*, in this first embodiment, a metal tie bar 34 with female threaded ends 35 is attached to the mounting brackets 25*a*. The purpose of the tie bar 34 is to secure the cables 50 to the tie bar 34 within the locking cover assembly 20*a* using, e.g., traditional zip ties or cable ties (not shown), so that the cables 50 cannot be pulled from the outside of the installed locking cover assembly 20*a* when the locking cover assembly 20*a* is in the locked position. The tie bar 34 sits parallel to the face of the front cover 22*a* and at a distance of about 2.75 to four inches from the face of the rack-mounted device 51 to allow room for the cables 50 to properly terminate at connections 52. The tie bar 34 is cylindrical in shape, and is solid, save for the internally threaded ends 35. The length of the tie bar 34 is substantially equal to the distance between the two mounting brackets 25*a*, approximately 19 inches.

Operation of First Embodiment

FIGS. 10*a* Through 10*e* and 11

Figure 10E:
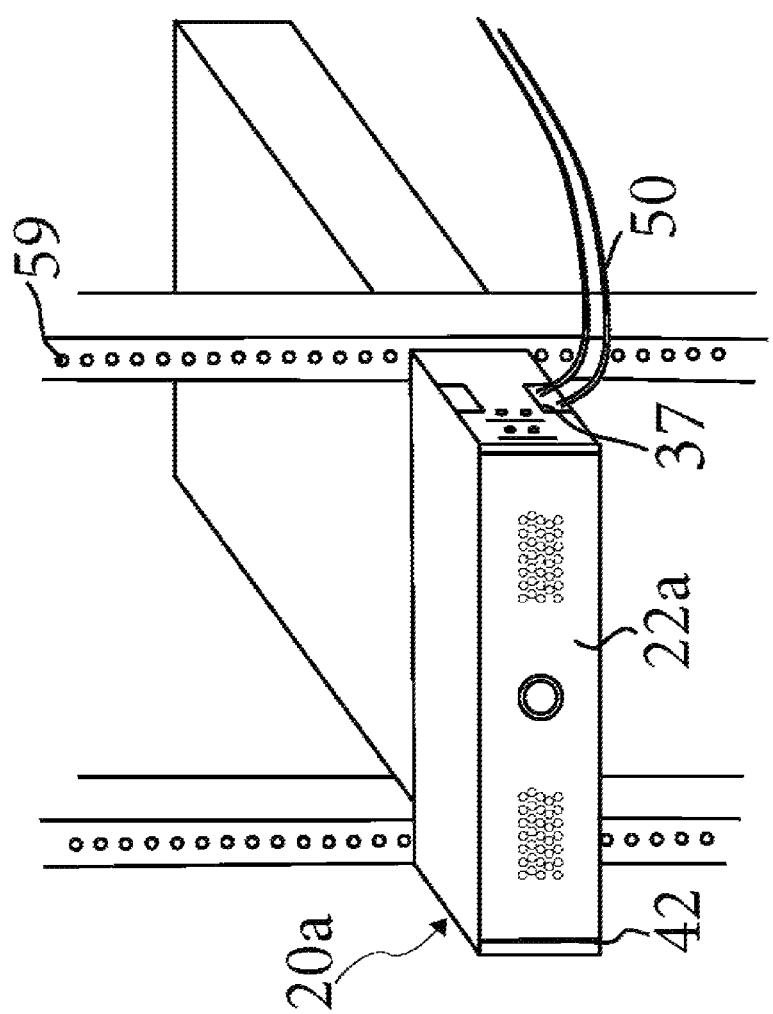

FIGS. 10*a* through 10*e* show how the locking cover assembly 20*a* can be installed over existing rack-mounted equipment 51 and directly to the rack system 53. Referring now to FIG. 10*b*, before the front cover 21*a* is installed, the mounting brackets 25*a* are fastened to the rack system 53 over existing rack-mounted devices 51. The mounting brackets 25*a* can also be installed over conventional rack ears if the rack-mounted device 51 is either center- or rear-mounted (not shown). The mounting brackets 25*a* are first secured by inserting a conventional threaded mounting fastener 36a through at least one of the fastener holes 27 in the rack interface tabs 26a into rack system holes 59 in the rack system 53, conventional rack ears, or rack-mounted equipment 51. The fastener holes 27 are spaced to accommodate both EIA/ECA standardized rack hole spacing and one-inch rack hole spacing. Once secured to the rack system 53, the mounting brackets 25a will, in turn, provide support for the locking cover assembly 20a, enabling the front cover 21a to be installed on any conventional rack system 53 without the need for additional modification or equipment.

Referring now to FIGS. 10c and 11, which illustrates an example of one embodiment, after the mounting brackets 25a are fastened to the rack system 53, a metal tie bar 34, with female threaded ends 35 can be attached to the mounting brackets 25a using conventional threaded mounting fasteners 36a. Alternatively, a tie bar 34 with non-threaded ends 35a (as shown in FIG. 2c) can be attached to the mounting brackets 25a using conventional automotive push-in retention fasteners 36b. The purpose of the tie bar is to secure the cables 50 to the tie bar 34 within the locked locking cover assembly 21a using, e.g., traditional zip ties or cable ties (not shown), so the cables 50 cannot be pulled from the outside of the installed locking cover assembly 21a when the locking cover assembly 21a is in the locked position. FIGS. 10d and 11 show how the cables 50 can be secured to the tie bar 34 underneath the front cover 21a.

Referring again to FIG. 10c, the tie bar 34 is sandwiched between the mounting brackets 25a and spans the entire distance between the inside of both mounting brackets 25a, approximately 19 inches (48.26 cm) for 19-inch rack systems 53, or 23 inches for conventional 23-inch rack systems (not pictured). There are multiple tie bar mounting holes 41 in each of the mounting brackets 25a. The tie bar 34 is aligned with the corresponding mounting holes 41 to sit horizontal, parallel to the installed equipment 51 and the front cover 21a. The tie bar 34 is then secured to the inside of the two mounting brackets 25a with two threaded mounting fasteners 36a inserted from the outside of each mounting bracket 25a. When the tie bar 34 is utilized to secure the cables 50 within the locking cover assembly 20a, the connections 52 cannot be removed by a party forcefully pulling on the attached cables 50 while the front cover 21a is in the locked position.

Once the tie bar 34 has been secured to the mounting brackets 25a, the front cover 21a is installed over the mounting brackets 25a as shown in FIG. 10e. In the first embodiment of the locking cover assembly 20a, the front cover 21a is installed by sliding the front cover 21a over the depth-wise sides 32 of the mounting brackets 25a via two vertical bracket-receiving slits 42 in the face the front cover 22a. The front cover 21a can be pushed flush against the rack-mounted equipment 51, or can be brought out (away from the rack-mounted equipment 51) by utilizing different cam-receiving slots 38 in the mounting brackets 25a, which run parallel to height 31 of the mounting brackets 25a and the front cover 21a. Using the cam-receiving slots 38 closest to the rack-mounted device 51 results in the front cover 21a being seated closest to the rack-mounted device 51. Utilizing cam-receiving slots 38 further from the rack-mounted device 51 results in the front cover 21a being slightly recessed from the rack-mounted device 51.

Exploded views of my locking cover assembly, shown in FIGS. 2b and 2c, show how the locking mechanism 28 is attached to the front cover 21a by inserting the rear portion of the locking mechanism 28 through the opening 29 in the face of the front cover 22a. The flanged portion of the locking mechanism 28 abuts the face of the front cover 22a, preventing the locking mechanism 28 from being pushed through the front cover 21a. The locking mechanism 28 is secured in place, with the cam 39 behind the face of the front cover 22a, by threading a conventional nut (not pictured) onto the locking mechanism 28. This secures the locking mechanism 28 in place, allowing the cam 39 to be turned from the outside of the front cover 21a by, for example, a conventional key (not shown), while preventing the locking mechanism 28 from being removed from the outside of the front cover 21a.

When the locking mechanism 28 is turned, the cams 39 are guided into the cam-receiving slots 38 in each mounting bracket 25a. The cams 39 and conventional lock cylinders (not pictured) operate in a conventional manner, the operation of which is also not pictured. When the cams 39 engage the mounting brackets 25a, the mounting brackets 25a are formed integral with the front cover 21a (creating the "locking cover assembly" 20a), preventing the locking assembly 20a from moving in any ordinate direction, and blocking access to the rack-mounted devices 51 and their connections 52. The locking cover assembly 20a is locked in place because the mounting brackets 25a prevent the locking cover assembly 20a from being moved up or down in the rack aperture, and the cams 39 in the locking mechanism 28 attached to face of the front cover 22a prevent the front cover 21a from being pulled away from the rack-mounted devices 51 (towards the user). The front cover 21a and mounting brackets 25a also cover the threaded mounting fasteners 36a attaching the rack-mounted devices 51 to the rack system 53, as shown in FIG. 10e. The front cover 21a must be unlocked and removed to re-access the mounting fasteners 36a.

Figure 12A:

To unlock the front cover 21a, the cams 39 are moved in the opposite direction (see directional arrows on FIGS. 12a (locked) and 12b (unlocked)), e.g., by the use of a conventional key (not shown), so the cams 39 disengage from the cam-receiving slots 38 in the mounting brackets 25a. This permits the user to slide the front cover 21a off of the mounting brackets 25a towards the user, and over any cables 50 routed through the cable-routing ports 37. Because the tie bar 34 remains connected to the mounting brackets 25a, and the mounting brackets 25a remain fastened to the rack system 53, removing the front cover 21a does not interfere with existing connections 52, even when the cables 50 are secured to the tie bar 34. Thus, the front cover 21a may be removed completely when unlocked, giving the user unobstructed access to rack-mounted devices 51 and any connections 52 attached thereto.

Descriptions of Alternative Embodiments

FIGS. 3, and 5a Through 9d

The size and locking configuration of the first embodiment, as illustrated in FIGS. 2a through 2d, can encompass any configuration of rack size and spacing known in the art. For example, as shown in FIGS. 3 and 5a through 7b, the mounting brackets 25b, 25c, 25d, 25e and front cover 21b, 21c, 21d, 21e can vary in height to cover rack-mounted devices 51 that take up 1-RU, 4-RUs, 6-RUs, and 10-RUs, respectively. However, my invention is not limited to the abovementioned sizes; it can be expanded to include any desired modifications to the size and locking mechanism configuration to accommodate various rack systems and rack-mount devices. These modifications include using multiple locking mechanisms 28 in the front cover 21a, 21b, 21c, 21d, 21e and using different types of locking mechanisms 28 to secure the front cover 21a, 21b, 21c, 21d, 21e to the mounting brackets 25a, 25b, 25c, 25d, 25e, as shown in FIGS. 8a through 9d, respectively. The different types of locking mechanisms 28 include tubular key-activated locks 55, slotted key-activated locks 56, combination locks 57, and keypad locks 58.

Figure 3:
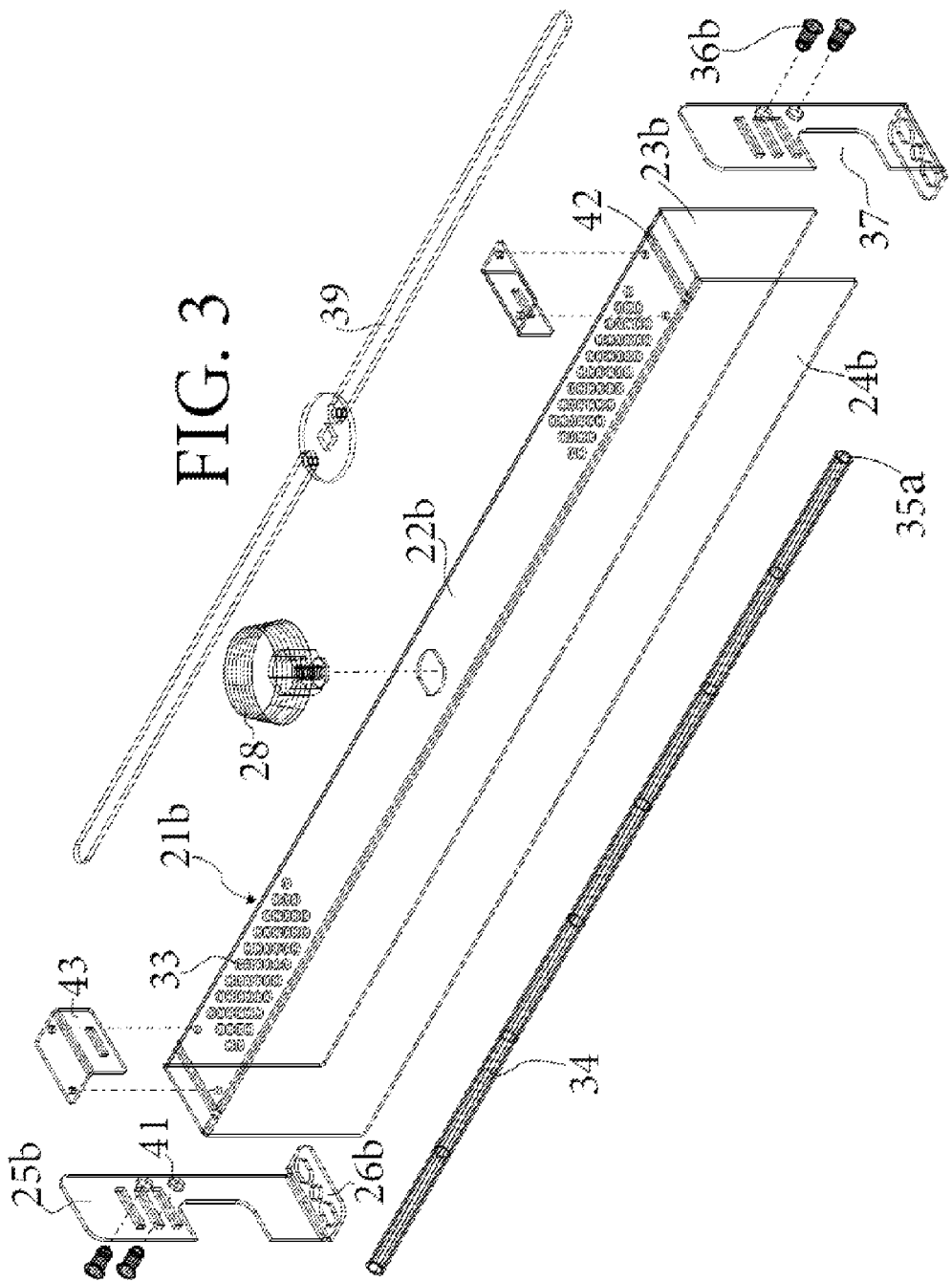

FIGS. 3 and 5a through 7b show that, to accommodate the different sized front covers 21b, 21c, 21d, and 21e, multiple other variations of mounting brackets 25b, 25c, 25d, 25e exist. FIG. 3 shows an example of a second embodiment where the front cover 21b is the same width as the 2-RU front cover 21a (approximately 20 inches (50.8 cm)), but the height is only sufficient to cover a 1-RU rack-mounted device, approximately 1.75 inches (4.445 cm) high.

FIGS. 5a and 5b provide an example of a third embodiment of my locking cover assembly 20c where the front cover 21c is the same width as the 2-RU front cover 21a (approximately 20 inches (50.8 cm)), but the height is sufficient to cover a 4-RU rack-mounted device, approximately 7 inches (17.78 cm) high.

FIGS. 6a and 6b provide an example of a fourth embodiment of my locking cover assembly 20d where the front cover 21d is the same width as the 2-RU front cover 21a (approximately 20 inches (50.8 cm)), but the height is sufficient to cover a 6-RU rack-mounted device, approximately 10.5 inches (26.67 cm) high.

FIGS. 7a and 7b provides an example of a fifth embodiment of a locking cover assembly 20e where the front cover 21e is the same width as the 2-RU front cover 21a (approximately 20 inches (50.8 cm)), but the height is sufficient to cover a 10-RU rack-mounted device, approximately 17.5 inches (44.45 cm) high.

The height, depth, and width of the front cover can be adjusted in other embodiments so the locking cover assembly can protect rack-mounted devices of different sizes in different rack-mount configurations, such as conventional 23-inch rack systems and rack-mount devices (not pictured).

The mounting brackets can also vary in terms of the number and size of mounting fastener holes 27, and the number and size of cam-receiving slots 38.

The mounting brackets 25a, 25b, 25c, 25d, 25e and front cover 21a, 21b, 21c, 21d, 21e may be made of any materials, including plastic or metal, which would sufficiently protect rack-mounted devices 51 by way of being suitably strong and tamper resistant. One such material is 14-gauge steel, although other materials may be used, such as materials known to those of skill in the art. The ventilation holes 33 in the face of the front cover 22a, 22b, 22c, 22d, 22e can also take various forms, such as holes or slits, to provide adequate ventilation for installed rack-mounted devices 51 that require airflow for proper operation, while still providing adequate tamper-resistant protection.

The tie bar 34 (shown in FIGS. 1 through 3, and 5a through 7b) is made of metal and is cylindrical in shape. The tie bar 34 can also be any shape or material that serves its above-mentioned function. The tie bar 34 can also have non-threaded, hollowed ends 35a to attach to the mounting brackets 25a, 25b, 25c, 25d, 25e using conventional automotive push-in retention fasteners 36b or conventional compression-fitting bolts.

Figure 2D:
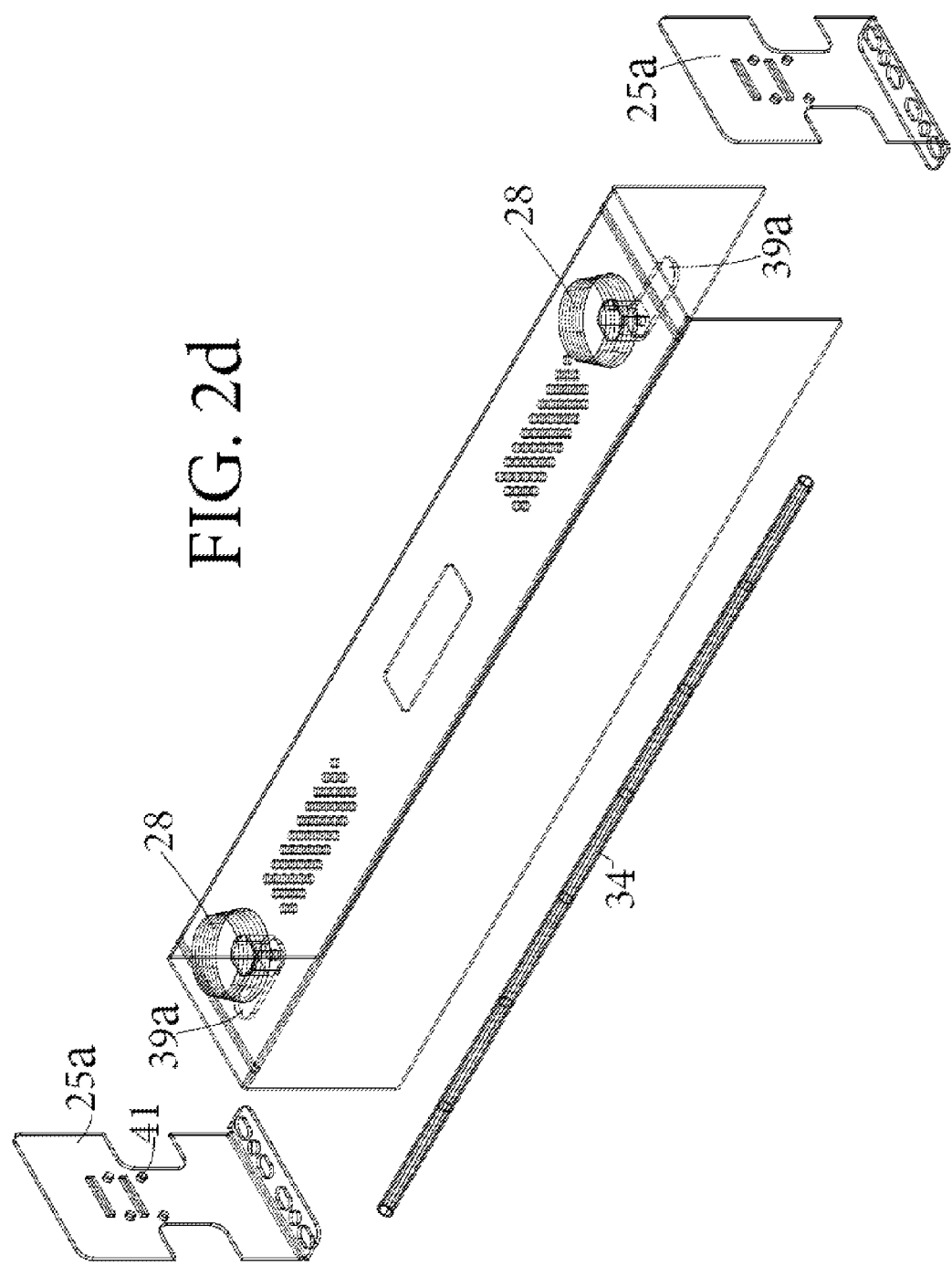

In addition to different sizes, the locking cover assembly 20a, 20b, 20c, 20d, 20e can have different types and configurations of locking mechanisms 28. FIGS. 8a through 9d illustrate how the number and type of locking mechanism 28 can vary. For example, the front cover 21a, 21b, 21c, 21d, 21e can have two single-cam locking mechanisms 28. Although the locks may be placed in different locations, FIG. 2d provides an example of one embodiment of a locking mechanism configuration where two single-cam locking mechanisms 28 are located on opposite sides of the front cover 21a. In this embodiment, each single-cam locking mechanism 28 rotates individually to move the cam 39a into or out of the cam-receiving slots 38 in the mounting brackets 25a.

A second embodiment of locking mechanism configuration is shown in FIGS. 2a and 2b. In this embodiment, there is a centrally located dual-cam conventional gang lock locking mechanism 28 with cam guides 43 on either side of the front cover 21a.

Figure 12B:
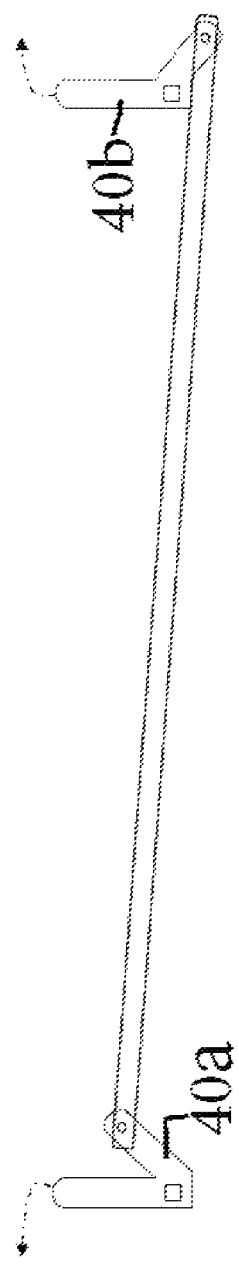

A third embodiment of locking mechanism configuration is shown in FIGS. 2c and 5a through 7b. In this linked-lock embodiment, two locking mechanisms 28 are attached by a bar 44 that prevents either cam 40a, 40b from rotating independent of one another. In this synchronized, linked-lock design, both locking mechanisms 28 must be simultaneously turned to their respective unlocked position to unlock the front cover 21a, 21b, 21c, 21d, 21e from the mounting brackets 25a, 25b, 25c, 25d, 25e. FIGS. 12a and 12b show the directional rotation of the cams 40a, 40b in the linked-lock embodiment.

In this link-locked embodiment, the front cover 21a, 21b, 21c, 21d, 21e cannot be removed if only one locking mechanism 28 is unlocked due to the restricted movement of either cam 40a, 40b created by the bar 44. The bar 44 attaches to each cam 40a, 40b by a secondary extension on each cam 40a, 40b at complementary angles, such as 45 degrees and −135 degrees relative to the locking portion of the cams 40a, 40b. In this linked-lock embodiment, the bar 44 is the same length as the distance between the center of the two locking mechanisms 28, so that the bar 44 and both locking mechanisms 28 must move synchronously at the same rotational speed to engage or disengage the cams 40a, 40b from the mounting brackets 25a, 25b, 25c, 25d, 25e. Thus, by attaching the bar 44 to each cam 40a, 40b, neither locking mechanism 28 can turn in either direction without the other locking mechanism 28 also being turned at the same time.

Therefore, in the synchronized, linked-lock design, one locking mechanism 28 cannot turn its own cam 40a, 40b to unlock one side, which in turn prevents the front cover 21a, 21b, 21c, 21d, 21e from being forced over either mounting bracket 25a, 25b, 25c, 25d, 25e and allowing access to the rack-mounted device 51 when only one locking mechanism 28 is unlocked. When the two cams 40a, 40b are linked in this dependent fashion, it allows the user to create an added layer of security. For example, the user may require the use of two different keys or two distinct combinations, one for each locking mechanism 28. The user may also assign separate keys or combinations to two or more different personnel so as to require two different people to unlock the front cover 21a, 21b, 21c, 21d, 21e from the mounting brackets 25a, 25b, 25c, 25d, 25e. FIGS. 5a through 7b show the synchronized, linked-lock design employed in 2-RU 20a, 1-RU 20b, 4-RU 20c, 6-RU 20d, and 10-RU 20e locking cover assemblies.

FIGS. 8a through 9d further illustrate how the type of locking mechanisms can vary. In one embodiment, the locking mechanism is a tubular keyed lock 55. A second embodiment of locking mechanisms 28 use slotted keyed locks 56. A third embodiment of locking mechanisms use combination locks 57. A fourth embodiment of locking mechanisms use keypad locks 58. These different locking mechanisms 28 can also be located in a variety of places on the front cover 21a, 21b, 21c, 21d, 21e and can take the form of independent or dependent (synchronized) linked-lock designs.

Other types of cam alternatives are capable of being employed, such as conventional sliding bolts, bars, or rods (not pictured).

Advantages

From the description above, there are numerous advantages of my locking cover assembly 20a, 20b, 20c, 20d, 20e in multiple embodiments that become evident:

(a) The locking cover assembly 20a, 20b, 20c, 20d, 20e can be easily installed over existing rack-mounted devices 51 and connections 52; there is no need to disrupt service or remove connections 52 or cables 50.

(b) The mounting brackets 25a, 25b, 25c, 25d, 25e with their plurality of fastener holes 27, can be secured directly to existing equipment 51, directly to rack systems 53, or to conventional rack ears. This makes the locking cover assembly 20a, 20b, 20c, 20d, 20e extremely versatile and operational in many different applications.

(c) The locking cover assembly 20a, 20b, 20c, 20d, 20e envelops the entire rack-mounted device 51, rack aperture, and connections 52 so that the rack-mounted device 51 cannot be removed or accessed when the locking cover assembly 20a, 20b, 20c, 20d, 20e is installed and in the locked position. Access to internally secured connections 52 is precluded because the top plane of the front cover 23a, 23b, 23c, 23d, 23e and bottom plane of the front cover 24a, 24b, 24c, 24d, 24e prevent access to the connections 52 from the top and bottom; the mounting brackets 25a, 25b, 25c, 25d, 25e preclude access from the sides; and the face of the front cover 22a, 22b, 22c, 22d, 22e guards the front, forming a five-sided "box" (the locking cover assembly 20a, 20b, 20c, 20d, 20e) over the rack-mounted device 51.

(d) The locking cover assembly 20a, 20b, 20c, 20d, 20e can isolate individual rack-mounted devices 51 in a co-location—where many rack-mounted devices 51 are installed in one location and several parties need access to the entire rack system 53, but not every party needs access to each rack-mounted device 51. The locking cover assembly 20a, 20b, 20c, 20d, 20e allows the user to select which individual or group of rack-mounted device 51 to protect.

(e) The locking cover assembly 20a, 20b, 20c, 20d, 20e does not require the use of hinges, which allows the locking cover assembly 20a, 20b, 20c, 20d, 20e to function in narrowly-spaced rack systems where the use of hinged covers are not feasible.

(f) The locking cover assembly 20a, 20b, 20c, 20d, 20e does not require the use of drawer or tray systems, and therefore does not require removal and reinstallation of existing rack-mounted devices 51.

Although the description above contains much specificity, it should not be construed as limiting the scope of the embodiments. Numerous modifications and alternative embodiments of the locking cover assembly will be apparent to those skilled in the art in view of the foregoing description. Thus, this description is to be construed as illustrative only and for the purpose of teaching those skilled in the art how to carry out the locking cover assembly. Details of the locking cover assembly may vary without departing from the spirit of the invention, and the exclusive use of all modifications that come within the scope of the claims is reserved. It is intended that the locking cover assembly be limited only to the extent required by the appended claims and the applicable rules of law.

What it claimed is:

1. A removable, locking cover assembly for rack-mounted equipment, the assembly comprising:
   two mounting brackets;
   conventional fasteners to secure said mounting brackets to both sides of a rack system or rack-mounted equipment;
   a tie bar;
   conventional fasteners to secure said tie bar to said mounting brackets, whereby said tie bar is sandwiched between said mounting brackets;
   a cover having (i) a top portion, (ii) a bottom portion, (iii) a front portion, (iv) at least one locking mechanism housed in said front portion of said cover, and (v) two vertical slits in said cover perpendicular to said front portion of said cover; wherein said top portion, said bottom portion, and said front portion of said cover are joined at right angles to form three lengthwise sides of a rectangular cuboid with one open lengthwise side of said rectangular cuboid for sliding said cover over said rack-mounted equipment and any cables and connections attached to said rack-mounted equipment; wherein the cover slidably mounts over said mounting brackets via said two slits in said cover; and wherein said locking mechanism is movable between a locked position and an unlocked position, whereby when said locking mechanism is in said locked position, it engages said mounting brackets, and whereby said cover, said mounting brackets, and said tie bar are contiguously formed integral and surround said rack-mounted equipment and said cables and other connections running to said rack-mounted equipment.

2. The cover of claim 1 wherein said cover has a plurality of ventilation openings, whereby said cover and said mounting brackets can envelop said rack-mounted equipment and said cables and other connections while providing adequate airflow into and out of said rack-mounted equipment so that said rack-mounted equipment can operate properly.

3. The mounting brackets of claim 1 wherein each said mounting bracket has a plurality of fastener holes for attaching said tie bar to the two said mounting brackets by inserting said conventional fasteners through said mounting brackets into said tie bar, and for securing said tie bar to said mounting brackets, and adjusting where said tie bar sits relative to said cover, so that said tie bar is substantially parallel with the front of said rack-mounted equipment.

4. The mounting brackets of claim 1 wherein said mounting brackets have a plurality of cable management ports, whereby said cables and other connections can be routed through said cable management ports.

5. The mounting brackets of claim 1 wherein said mounting brackets have a plurality of vertical slots of a predetermined width and height.

6. The locking mechanism of claim 1, said locking mechanism having at least one
   cam that moves in and out of the plurality of vertical slots in said mounting brackets for engaging said locking mechanism housed in said cover with said mounting brackets, whereby said cover and said mounting brackets are formed integral when said locking mechanism is in said locked position.

7. The locking mechanism of claim 6 wherein said locking mechanism utilizes a key to move said locking mechanism between said locked position and a said unlocked position.

8. The locking mechanism of claim 6 wherein said locking mechanism utilizes a combination lock to move said locking mechanism between said locked position and a said unlocked position.

9. The locking mechanism of claim 6 wherein said locking mechanism utilizes a keypad to move said locking mechanism between said locked position and said unlocked position.

10. The cover of claim 1 further including a two-pronged tab attached to each said locking mechanism, one said two-pronged tab having an acute angle between each tab, and the other said two-pronged tab having an obtuse angle between each tab.

11. The cover of claim 10 further including a bar-cam attached to each said two-pronged tab; wherein said bar-cam is equal in length to the distance between the center of said locking mechanisms, whereby said bar-cam prevents either said locking mechanism from being turned independently.

12. The tie bar of claim 1 wherein said tie bar is a rod made of aluminum, steel, or other substantially rigid material, having sufficient rigidity to restrict bending and flexing when said tie bar is installed between said mounting brackets.

13. The tie bar of claim 12 wherein said tie bar has threaded ends, whereby said tie bar is secured to said mounting brackets with said conventional fasteners through said fastener holes in each said mounting bracket.

14. The tie bar of claim 12 wherein said tie bar is hollow, having non-threaded ends, and is secured to said mounting brackets with conventional compression-fitting bolts through said fastener holes in each said mounting bracket.

15. The cover and mounting brackets of claim 1 wherein said cover and said mounting brackets are made of metal of a predetermined composition and gauge.

16. The cover and mounting brackets of claim 1 wherein said cover and said mounting brackets are made of plastic of a predetermined composition and thickness.

17. A locking cover assembly to fit over rack-mounted equipment and cables running to said rack-mounted equipment, the assembly comprising:
   a front cover having three sides, a front portion, a bottom portion, and a top portion; wherein said front portion, said bottom portion, and said top portion contiguously form three lengthwise sides of a rectangular cuboid; and wherein said front portion houses at least one locking mechanism, said locking mechanism having at least one cam;
   a tie rod having hollow ends;
   and at least two mounting brackets, each said mounting bracket having (i) a plurality of vertical, linear slots configured to mate with said cam in said locking mechanism, (ii) a plurality of circular holes configured to mate with said tie rod, (iii) a plurality of ports on the upper and lower sides of said mounting brackets sufficient in size to allow said cables running to said rack-mounted equipment to fit through said ports.

18. The front cover of claim 17 wherein said front portion of said front cover has a plurality of ventilation holes, whereby said rack-mounted equipment can receive adequate airflow to properly function.

19. The front cover of claim 17 wherein said front portion of said front cover has two vertical, linear slots that are perpendicular to said front cover, whereby said mounting brackets slidably mount through said front cover and contiguously form five sides of a rectangular cuboid that envelops said rack-mounted equipment, and whereby, when said locking mechanism and said mounting brackets are engaged, said rack-mounted equipment cannot be accessed from any ordinal direction.

20. A method of securing a locking cover to a rack system and over a rack-mounted device and existing cabling, comprising:
   (a) providing at least two mounting brackets having a plurality of fastener holes, conventional fasteners, and tabs extending from said mounting brackets at ninety-degree angles, whereby said mounting brackets can be secured to said rack system by inserting said conventional fasteners through said integral tabs and into said rack system;
   (b) providing ports in said mounting brackets to allow said existing cabling to run outside of said mounting brackets;
   (c) providing a tie bar secured to each said mounting bracket using said conventional fasteners, whereby said existing cabling is securable to said tie bar;
   (d) providing a front cover having two slots for interfacing with said mounting brackets, whereby said front cover slides over said mounting brackets and abuts said rack system;
   (e) providing at least one locking mechanism coupled to said front cover having a locked position and an unlocked position;
   (f) providing locking members housed in said locking mechanisms that move laterally to engage with said mounting brackets;
   (g) locking said front cover to said rack system by turning said locking mechanism to said locked position, whereby said rack-mounted device is inaccessible; unlocking said front cover from said rack system by turning said locking mechanism to said unlocked position, whereby said front cover is removable from said rack system and said rack-mounted device, providing unobstructed access to said rack-mounted device.

\* \* \* \* \*